(12) United States Patent
Nishimura et al.

(10) Patent No.: US 6,194,916 B1
(45) Date of Patent: *Feb. 27, 2001

(54) PHASE COMPARATOR CIRCUIT FOR HIGH SPEED SIGNALS IN DELAY LOCKED LOOP CIRCUIT

(75) Inventors: Koichi Nishimura; Yoshinori Okajima, both of Kawasaki (JP)

(73) Assignee: Fujitsu Limited, Kawasaki (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/869,216

(22) Filed: Jun. 4, 1997

(30) Foreign Application Priority Data

Jan. 17, 1997 (JP) .................................................. 9-006796

(51) Int. Cl.$^7$ .................................................. G01R 25/00
(52) U.S. Cl. ........................ 327/12; 327/147; 327/107; 331/25; 375/375
(58) Field of Search .................................. 327/2, 3, 7, 12, 327/147, 149, 150, 152, 153, 156, 158, 159, 107; 331/25, 1 A; 375/215, 294, 327, 375, 376

(56) References Cited

U.S. PATENT DOCUMENTS

| | | | |
|---|---|---|---|
| 4,658,217 | * 4/1987 | Takatori | 327/2 |
| 4,904,948 | * 2/1990 | Asami | 327/3 |
| 5,008,629 | * 4/1991 | Ohba et al. | 327/107 |
| 5,059,833 | * 10/1991 | Fuji | 327/12 |
| 5,120,990 | * 6/1992 | Koker | 327/2 |
| 5,142,555 | * 8/1992 | Whiteside | 327/2 |
| 5,162,746 | * 11/1992 | Ghoshal | 327/160 |
| 5,530,383 | * 6/1996 | May | 327/3 |
| 5,619,489 | * 4/1997 | Guo | 327/12 |
| 5,627,496 | * 5/1997 | Gross, Jr. | 327/3 |

FOREIGN PATENT DOCUMENTS

| | | |
|---|---|---|
| 55-92042 | 7/1980 | (JP) . |
| 56-61833 | 5/1981 | (JP) . |
| 61-131914 | 6/1986 | (JP) . |
| 63283233 | 11/1998 | (JP) . |

* cited by examiner

Primary Examiner—Timothy P. Callahan
Assistant Examiner—Minh Nguyen
(74) Attorney, Agent, or Firm—Arent Fox Kintner Plotkin & Kahn, PLLC

(57) ABSTRACT

A phase comparator compares the phases of first and second signals with each other. The phase comparator has a first control circuit, a second control circuit, and a phase comparator unit. The first control circuit divides the frequency of the first signal by n in response to a third signal where n is an integer equal to or larger than 2. The second control circuit divides the frequency of the second signal by n in response to the third signal. The phase comparator unit compares the phases of signals provided by the first and second control circuits with each other. The phase comparator unit is capable of correctly comparing the phases of even high-speed signals with each other, and therefore, is applicable to a DLL circuit that operates on high-speed clock signals.

29 Claims, 28 Drawing Sheets

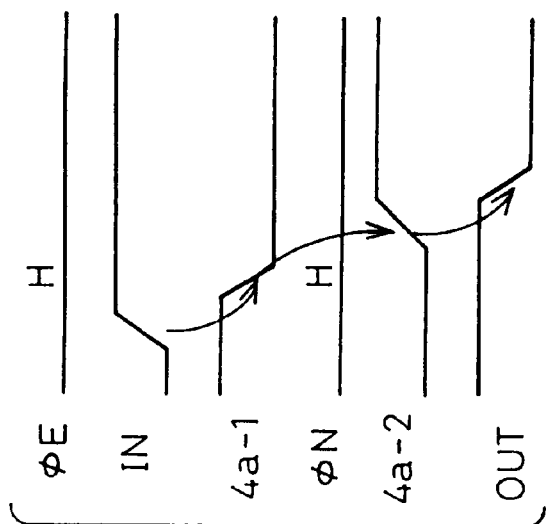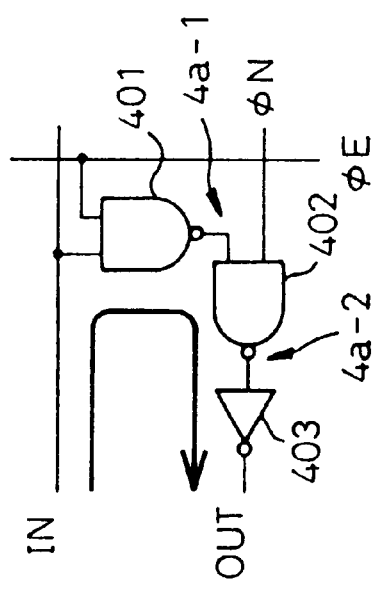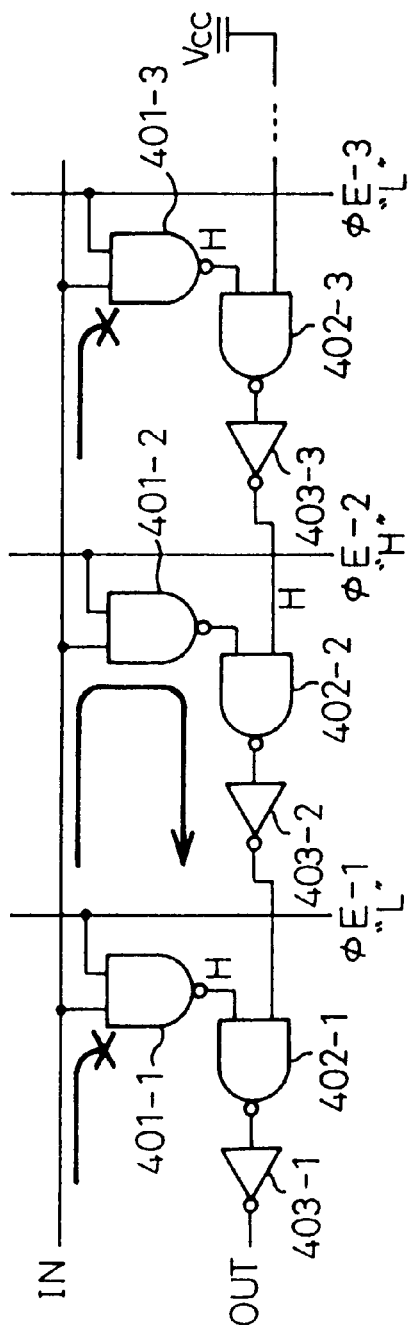

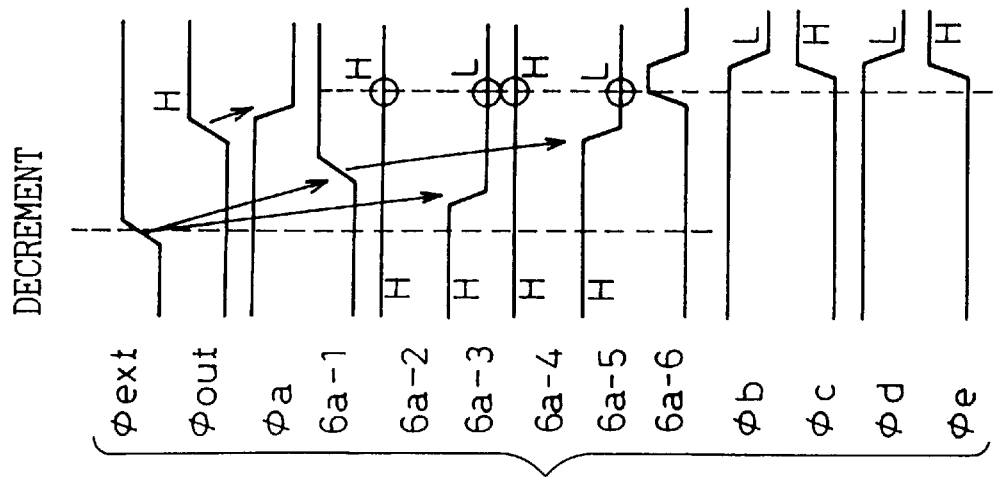
Fig.18C DECREMENT
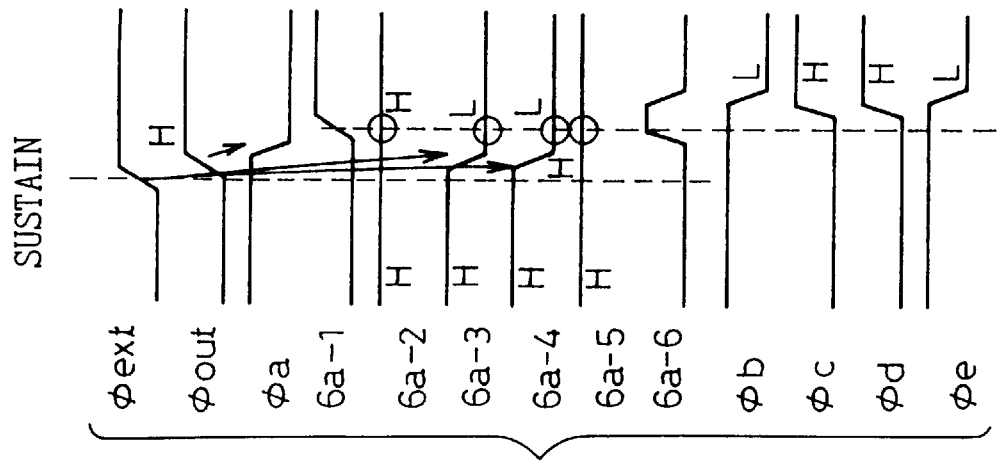
Fig.18B SUSTAIN
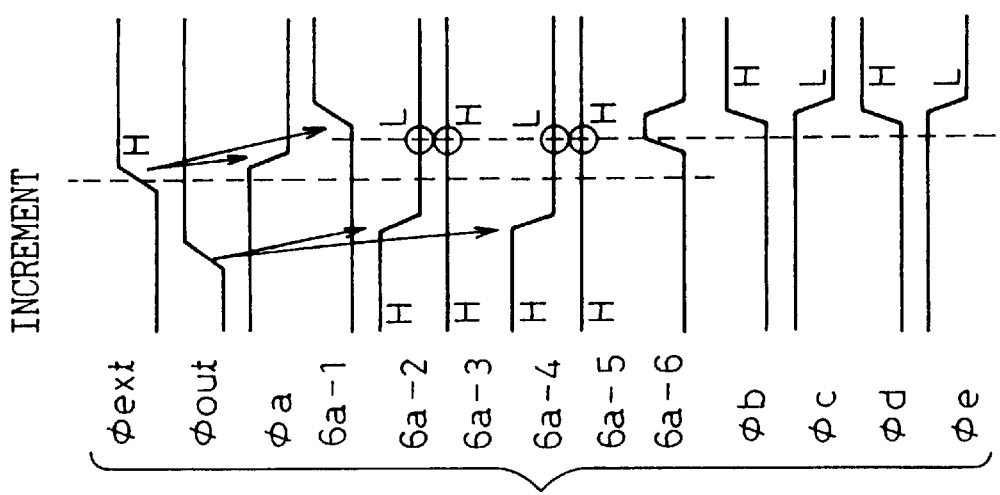
Fig.18A INCREMENT

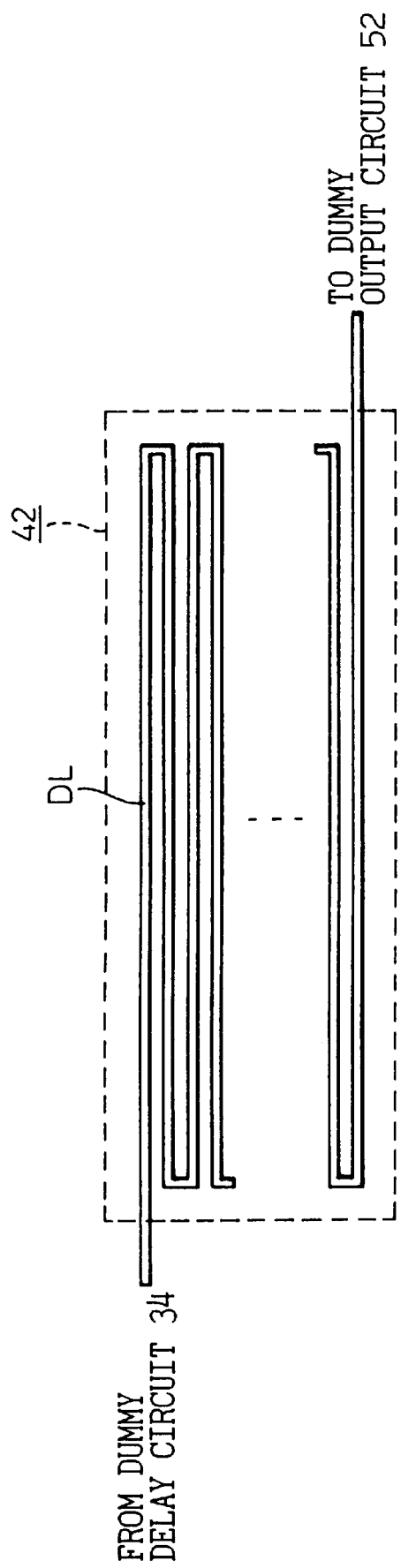

PHASE COMPARATOR CIRCUIT FOR HIGH SPEED SIGNALS IN DELAY LOCKED LOOP CIRCUIT

BACKGROUND OF THE INVENTION

1. Field of the Invention

The present invention relates to a phase comparator and a semiconductor integrated circuit, and more particularly, to a phase comparator for a delay locked loop (DLL) circuit and a semiconductor integrated circuit employing the DLL circuit.

2. Description of the Related Art

Recently, the operating speeds of semiconductor integrated circuits have increased, and the circuit scale thereof has become large. Further, it has become necessary to supply a synchronized signal (phase synchronized clock signal) to a specific circuit in a large scale semiconductor integrated circuit.

Namely, recent high-speed, highly-integrated semiconductor circuits need phase-synchronized clock signals. For example, synchronous DRAMs (SDRAMs) employ a DLL (Delay Locked Loop) circuit that generates an internal clock signal in synchronization with an externally supplied clock signal and supplies the internal clock signal to output buffer circuits. As the frequency of the external clock signal increases, a phase difference between the external and internal clock signals increases. Even if the frequency of the external clock signal is high, the DLL circuit must correctly compare the phases of the external and internal clock signals with each other and synchronize the internal clock signal with the external clock signal.

Recent MPUs and memory devices such as SDRAMs operate at a speed of 100 MHz or faster. These devices employ the DLL circuit to lock the phase of an internal clock signal with that of an externally supplied clock signal, to thereby absorb a delay caused by internal clock lines and stabilize an accessing time.

When the frequencies of the external and internal clock signals are high, it is difficult for the DLL circuit to compare the phases of the signals with each other. To cope with this problem, a prior art has proposed a phase locked loop (PLL) circuit that divides the frequencies of the external and internal clock signals at a given ratio and compares the phases of the frequency-divided clock signals with each other. This technique is disclosed in, for example, Japanese Unexamined Patent Publication (Kokai) Nos. 55-92042 and 56-61833.

The conventional PLL circuit and related DLL circuit and the problems thereof will be explained later in detail with reference to drawings.

SUMMARY OF THE INVENTION

An object of the present invention is to provide a phase comparator capable of correctly comparing the phases of high-speed clock signals with each other and applicable to a DLL circuit that operates on high-speed clock signals. Another object of the present invention is to provide a semiconductor integrated circuit that employs such a DLL circuit.

According to the present invention, there is provided a phase comparator for comparing phases of first and second signals with each other, comprising a first control circuit for dividing a frequency of the first signal by n in response to a third signal where n is an integer equal to or larger than 2; a second control circuit for dividing a frequency of the second signal by n in response to the third signal; and a phase comparator for comparing phases of signals provided by the first and second control circuits with each other.

The phase comparator may be incorporated in a DLL circuit so that the DLL circuit determines a delay according to a phase comparison result provided by the phase comparator.

Further, according to the present invention, there is also provided a semiconductor integrated circuit having a delay circuit for delaying a first signal and providing a second signal, a delay control circuit for controlling a delay of the delay circuit, and a phase comparator for comparing phases of the first and second signals with each other and controlling an operation of the delay control circuit accordingly, wherein the phase comparator comprises a first control circuit for dividing a frequency of the first signal by n in response to a third signal where n is an integer equal to or larger than 2; a second control circuit for dividing a frequency of the second signal by n in response to the third signal; and a phase comparator for comparing phases of signals provided by the first and second control circuits with each other.

Each period of a signal provided by any one of the first and second control circuits may comprise a first-level interval corresponding to Y periods of any one of the first and second signals and a second-level interval corresponding to Z periods of any one of the first and second signals where Y and Z are positive integers, respectively. The phase comparator may have a first RS flip-flop and a second RS flip-flop; the first RS flip-flop having a reset terminal to receive the signal provided by the first control circuit and a set terminal to receive the signal provided by the second control circuit, the second RS flip-flop having a reset terminal to receive the signal provided by the first control circuit through a delay circuit and a set terminal to receive the signal provided by the second control circuit, and the first and second RS flip-flops providing output signals whose combination is used to determine a phase comparison result.

Each of the first and second RS flip-flops may have a first NAND circuit and a second NAND circuit, the first NAND circuit having a first input serving as the reset terminal of the RS flip-flop and a second input connected to an output of the second NAND circuit serving as an output terminal of the RS flip-flop, the second NAND circuit having a first input serving as the set terminal of the RS flip-flop and a second input connected to an output of the first NAND circuit serving as an inverting output terminal of the RS flip-flop. Each of the NAND circuits may have a first p-channel transistor, a second p-channel transistor, a first n-channel transistor, and a second n-channel transistor; the first p-channel transistor having a source connected to a first power source line, a drain connected to the output of the NAND circuit, and a gate connected to the first input of the NAND circuit; the second p-channel transistor having a source connected to the first power source line, a drain connected to the output of the NAND circuit, and a gate connected to the second input of the NAND circuit; the first n-channel transistor having a source connected to the drain of the second n-channel transistor, a drain connected to the output of the NAND circuit, and a gate connected to the first input of the NAND circuit; and the second n-channel transistor having a source connected to a second power source line and a gate connected to the second input of the NAND circuit.

The semiconductor integrated circuit may further comprise a frequency divider for forming the third signal by dividing a signal, which has the same period as the first signal, by n. The semiconductor integrated circuit may further comprise a circuit for shifting the first signal by τ/N where τ is a delay of the second signal from the first signal and N is a positive integer and forming the third signal by dividing a frequency of the shifted signal by n with the use of the frequency divider.

A frequency dividing ratio of the first and second signals to be divided at the same timing may be ½$^m$ where m is a positive integer. Each of the first and second control circuits may have a first latch circuit for storing the third signal in response to a trigger signal that is an inversion of a corresponding one of the first and second signals, and a second latch circuit for storing signals held in the first latch circuit in response to a trigger signal that is the corresponding one of the first and second signals.

The semiconductor integrated circuit may comprise a first DLL circuit made of the above described semiconductor integrated circuit, a second DLL circuit, and an objective circuit, and one of output signals of the first and second DLL circuits may be selected and supplied to the objective circuit. The semiconductor integrated circuit may be a synchronous DRAM and the objective circuit may be an output circuit of the synchronous DRAM.

BRIEF DESCRIPTION OF THE DRAWINGS

The present invention will be more clearly understood from the description of the preferred embodiments as set forth below with reference to the accompanying drawings, wherein:

FIGS. 14A, 14B, and 14C are diagrams showing an example of a delay circuit of a semiconductor integrated circuit according to the present invention;

FIGS. 18A, 18B, and 18C are timing charts showing operations of the phase comparator of FIG. 17;

FIG. 28 is a diagram showing an example of a dummy line for transmitting a dummy internal clock signal in a semiconductor integrated circuit according to the present invention.

DESCRIPTION OF THE PREFERRED EMBODIMENTS

For a better understanding of the preferred embodiments of the present invention, a PLL circuit according to a prior art and a DLL circuit according to a related art and the problems thereof will be explained with reference to FIGS. 1 to 4.

Figure 1:
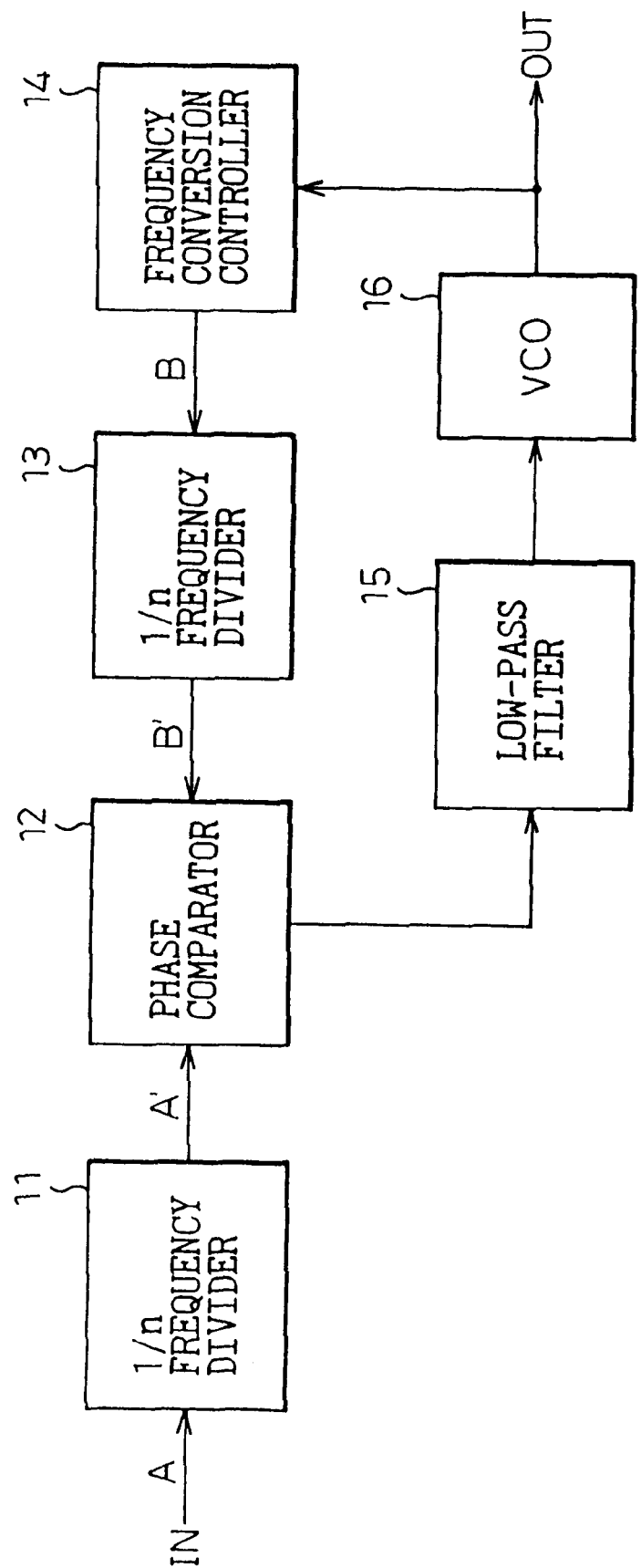
FIG. 1 is a block diagram showing a PLL circuit according to the prior art.

FIG. 1 is a block diagram showing the PLL circuit of the prior art. The PLL circuit has 1/n frequency dividers 11 and 13, a phase comparator 12, a frequency conversion controller 14, a low-pass filter 15, and a voltage-controlled oscillator (VCO) 16.

The PLL circuit provides an output signal OUT. The frequency conversion controller 14 receives the signal OUT and provides the frequency divider 13 with a signal B. An input signal IN, i.e., a signal A is supplied to the frequency divider 11. The frequency divider 11 divides the frequency of the signal A by n (for example, 4) and provides a signal A'. The period of the signal A' is n times as long as the period of the signal A. The frequency divider 13 divides the frequency of the signal B by n and provides a signal B'. The period of the signal B' is n times as long as the period of the signal B. The phase comparator 12 compares the phases of the signals A' and B' with each other.

Figure 2:
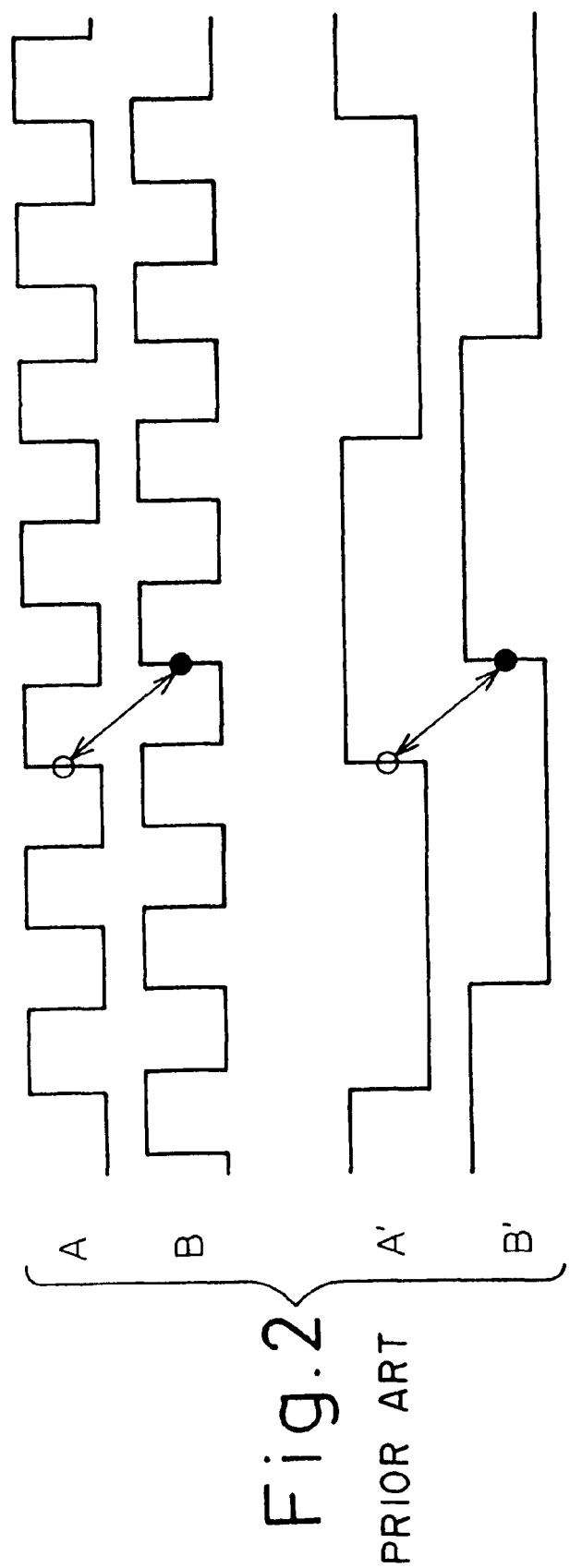
FIG. 2 is a timing chart showing an operation of the PLL circuit of FIG. 1.

FIG. 2 is a waveform diagram showing the operation of the PLL circuit of FIG. 1.

The frequency divider 11 divides the frequency of the signal A by 4 and forms the signal A' having a 4-times longer period than the signal A. The frequency divider 13 divides the signal B by 4 and forms the signal B' having a 4-times longer period than the signal B. The phase comparator 12 compares the phases of the signals A' and B' with each other. Even if the frequencies of the clock signals A and B are high and are difficult for the phase comparator 12 to compare the phases thereof with each other, the signals A' and B' have one-fourth frequencies of the original ones, i.e., 4-times longer periods than the original ones, to enable the phase comparator 12 to compare the phases of the signals A' and B' with each other. Consequently, a rise (a black dot in FIG. 2) of the signal B' is synchronized with a rise (a white dot) of the signal A', to secure a correct operation.

Figure 3:
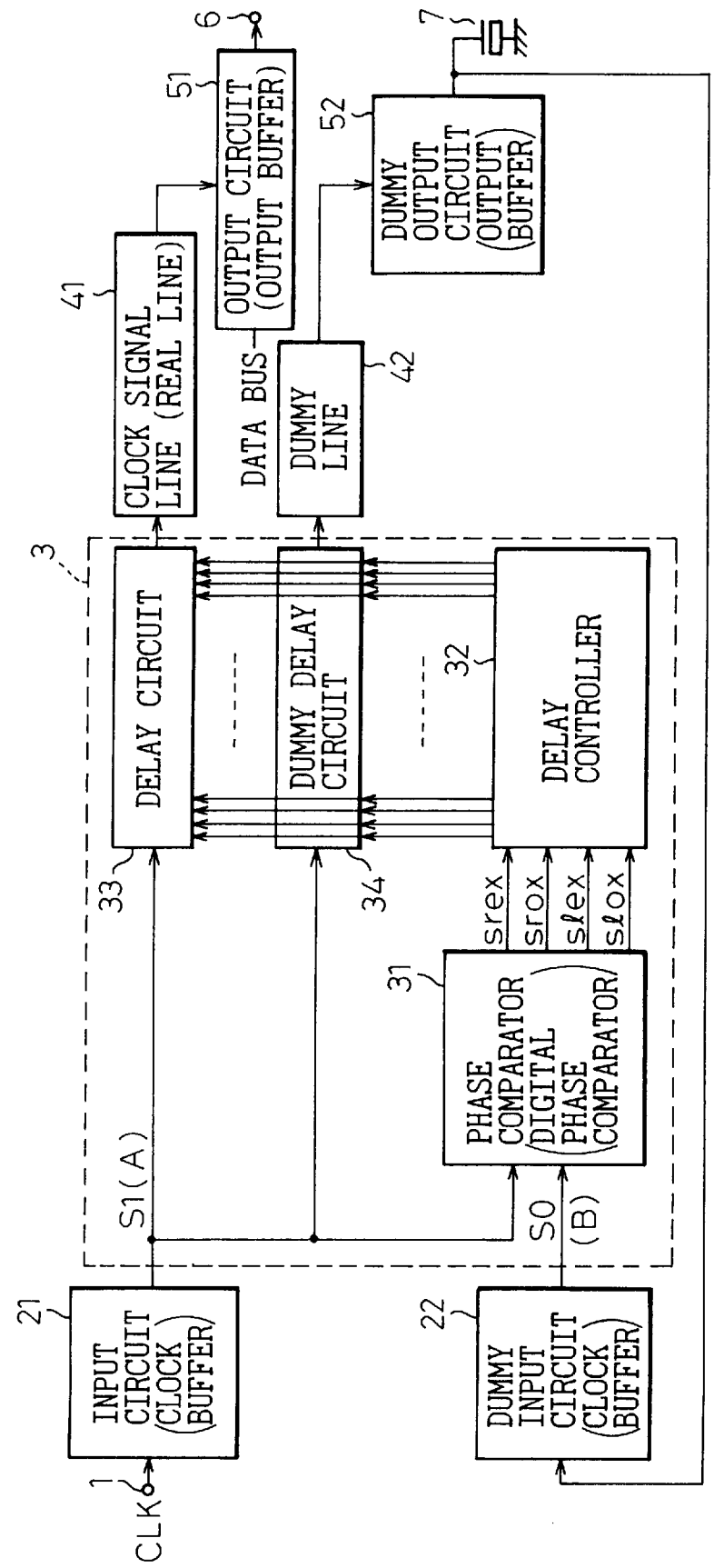
FIG. 3 is a block diagram showing a semiconductor integrated circuit employing a DLL circuit according to the related art.

FIG. 3 is a block diagram showing a DLL circuit 3 in a semiconductor integrated circuit according to the related art. The semiconductor integrated circuit has a clock input pad 1, a clock buffer serving as an input circuit 21, a clock buffer serving as a dummy input circuit 22, the DLL circuit 3, a clock signal line (real line) 41, a dummy line 42, an output buffer serving as an output circuit 51, an output buffer serving as a dummy output circuit 52, a data output pad 6, and a dummy load capacitor 7.

The DLL circuit 3 has a digital phase comparator 31, a delay controller 32, a delay circuit 33, and a dummy delay circuit 34. The input circuit 21 receives an external input clock signal CLK and provides a signal S1 (A). On the one hand, the signal S1 is directly supplied to the phase comparator 31. On the other hand, the signal S1 is passed through the dummy delay circuit 34, dummy line 42, dummy output circuit 52, and dummy input circuit 22 and is supplied as a signal S0 (B) to the phase comparator 31. The signal S0 is behind the external clock signal CLK (equal to the signal S1) by, for example, a period of the signal CLK. The phase comparator 31 compares the phases of the signals S1 and S0 with each other and controls the delay controller 32 accordingly.

The delay controller 32 may be a shift register. According to output signals such as right shift signals "srex" and "srox" for even and odd delay stages and left shift signals "slex" and "slox" for the even and odd delay stages provided by the phase comparator 31, the delay controller 32 provides delay signals to the delay circuit 33 and dummy delay circuit 34. As a result, an internal clock signal provided by the output circuit 51 has no apparent delay with respect to the external clock signal CLK even if the input circuit 21, delay circuit 33, real line 41, and output circuit 51 actually delay the external clock signal CLK.

When the circuit of FIG. 3 is used for an SDRAM operating at a higher frequency, the frequency of the external clock signal CLK must be high. Then, the phase comparator 31 hardly compares the phases of the signals S1 and S0 with each other. To solve this problem, the phase comparator 31 divides the frequencies of the signals S1 and S0 by n and compares the phases of the frequency-divided signals with each other, like the phase comparator 12 of the PLL circuit of FIG. 1.

Figure 4:
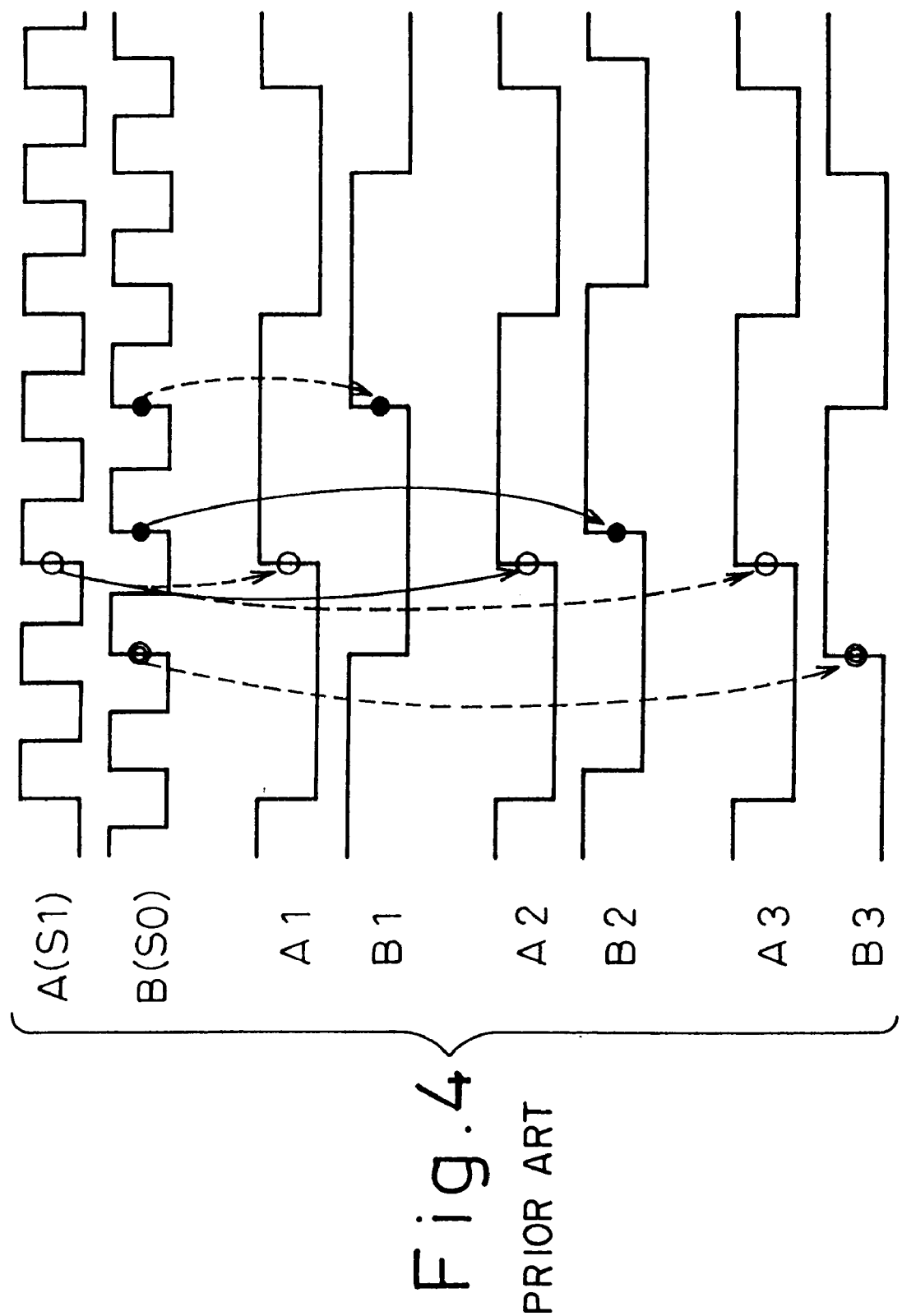
FIG. 4 is a timing chart for explaining the problems when applying the technique of the PLL circuit of FIG. 1 to the DLL circuit of FIG. 3.

FIG. 4 is a waveform diagram showing the problems which occur when the frequency dividing technique of the PLL circuit of FIG. 1 is applied to the DLL circuit of FIG. 3. When dividing the frequencies of the signals A (S1) and B (S0) by n (for example, 4), the signals A and B may be changed into A1 and B1, A2 and B2, or A3 and B3. The signal A1 is ahead of the signal B1 by an interval longer than a period of the signal A (or B). The signal A2 is ahead of the signal B2 by an interval within a period of the signal A. The signal A3 is behind the signal B3.

The delay of the signal S1 (A) is determined by the number of delay stages contained in the delay circuit 33. when the signal S1 is ahead of the signal S0 within a period of the signal S1 (or S0) like the signals A2 and B2, the delay circuit 33 is effective to synchronize the signal S0 with the signal S1. If the delay time of the delay circuit 33 is unable to cope with a phase difference larger than a period of the signal S1, the signal B1 will never be synchronized with the signal A1. Since the DLL circuit 3 synchronizes input and output signals by delaying the input signal, it is unable to synchronize the signals A3 and B3 because the signal A3 is already behind the signal B3.

In the case of the PLL circuit of FIG. 1, the frequency dividers 11 and 13 may divide the frequencies of the clock signals A and B at different timings because the VCO 16 automatically adjusts the phase of the signal B. On the other hand, if the DLL circuit 3 of FIG. 3 divides the frequencies of the clock signals S1 and S0 at individual timings, a phase difference between the frequency-divided signals is adjustable only when the delay time of the delay circuit 33 covers the phase difference. The delay time, i.e., the number of delay stages of the delay circuit 33 or the dummy delay circuit 34 is limited by an allocated space. Accordingly, the DLL circuit 3 is unable to synchronize the signals A and B (S1 and S0) with each other if they have the relationship of the signals A1 and B1 or of the signals A3 and B3 of FIG. 4.

Next, preferred embodiments of the present invention will be explained.

Figure 5:
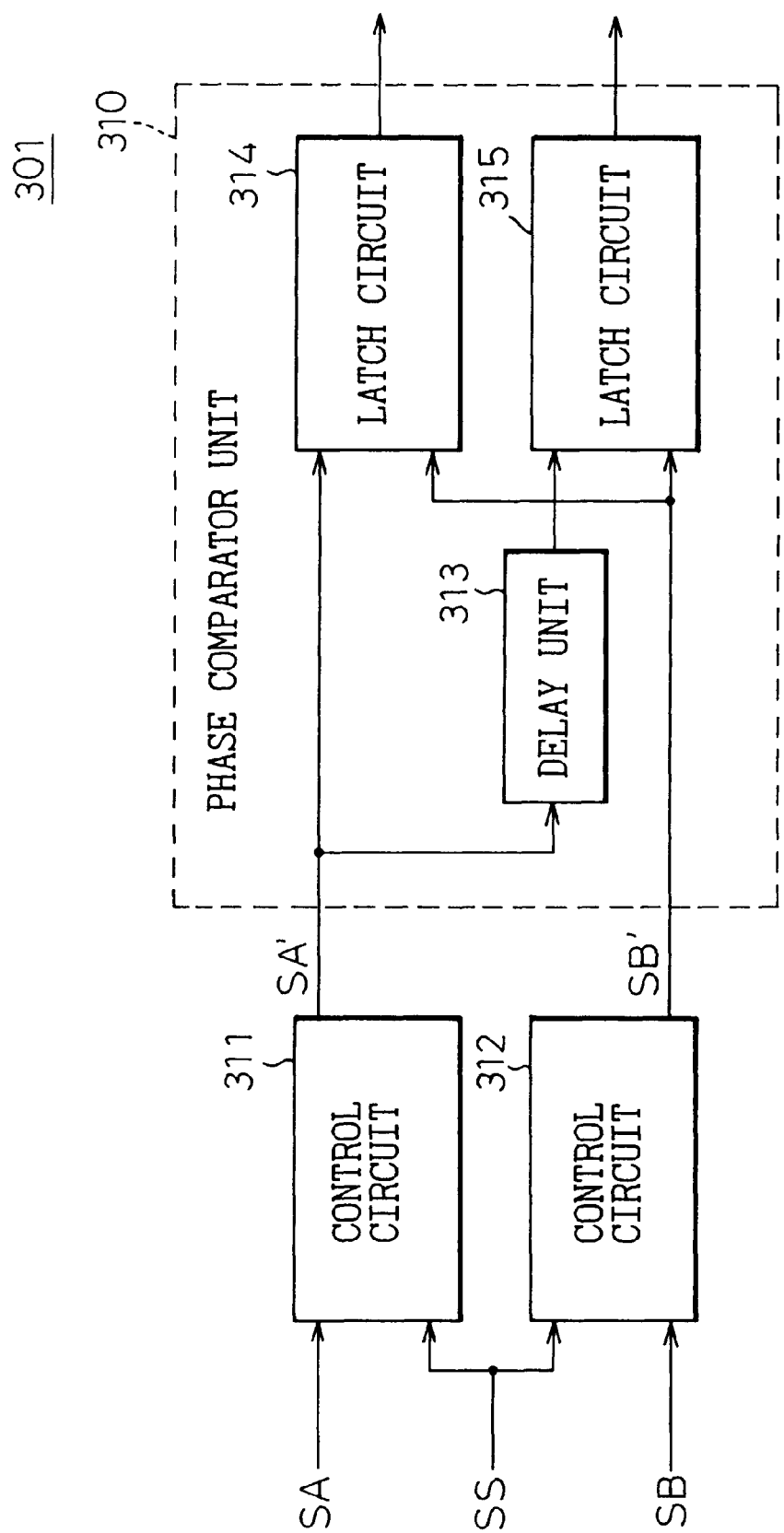
FIG. 5 is a block diagram showing an embodiment of a phase comparator according to the present invention.

FIG. 5 is a block diagram showing a phase comparator 301 according to an embodiment of the present invention. The phase comparator 301 has first and second control circuits 311 and 312 serving as first and second frequency dividers, a delay unit 313, and RS flip-flop circuits 314 and 315 serving as latch circuits. The delay unit 313 and latch circuits 314 and 315 form a phase comparator unit 310.

The phase comparator 301 can be used in a DLL circuit and compares the phase of a first signal SA with the phase of a second signal SB. The control circuit 311 divides the frequency of the signal SA by n (for example, 4) in response to a third signal SS. The control circuit 312 divides the frequency of the signal SB by n in response to the signal SS. The value n is an integer equal to or larger than 2.

The control circuit 312 provides a signal SB' to the latch circuits 314 and 315. The control circuit 311 provides a signal SA' to the latch circuit 314 and to the delay unit 313 whose output is supplied to the latch circuit 315. Note that the divided first signal (output signal of the first control circuit 311) SA' corresponds to a signal φout of FIG. 17 and that the divided second signal (output signal of the second control circuit 312) SB' corresponds to a signal φext of FIG. 17 which will be described later. Further, the latch circuit (first RS flip-flop) 314 corresponds to a flip-flop circuit 421 of FIG. 17, the latch circuit (second RS flip-flop) 315 corresponds to a flip-flop circuit 422 of FIG. 17, and the delay unit 313 corresponds to a delay circuit 423 of FIG. 17, respectively.

This embodiment makes the control circuits 311 and 312 divide the frequencies of the signals SA and SB by n (for example, 4) at the same timing based on the third signal SS. The frequency-divided signals SA' and SB' are supplied to the latch circuits 314 and 315, which compare the phases of the signals SA' and SB' with each other.

Figure 9:
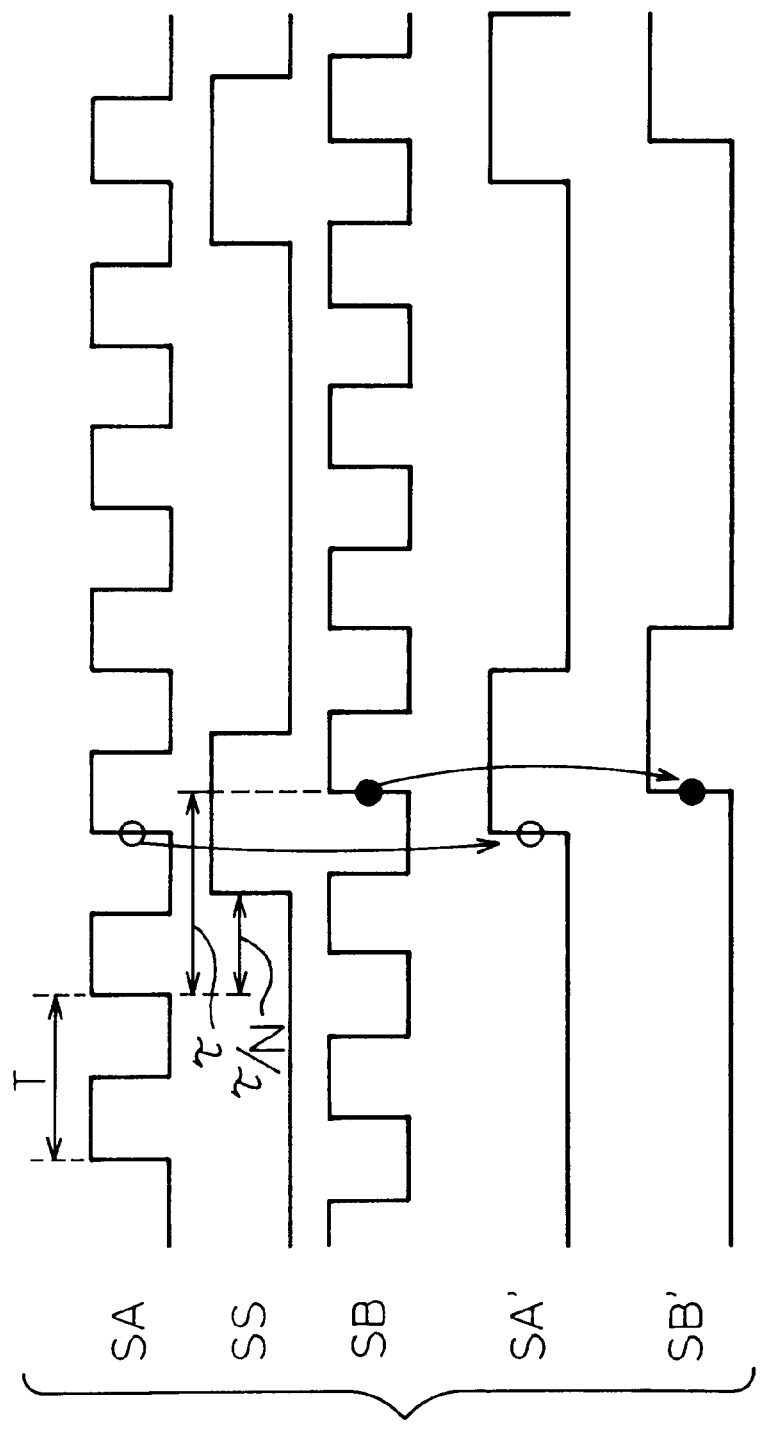
FIG. 9 is a timing chart showing an operation of the phase comparator provided in the DLL circuit of FIG. 8.

A period of each of the frequency-divided signals SA' and SB' may consist of a high-level interval and a low-level interval each corresponding to two periods of the signal SA or SB, as shown in FIG. 9. Instead, a period of each of the signals SA' and SB' may consist of a high-level interval corresponding to a period of the signal SA or SB and a low-level interval corresponding to three periods of the signal SA or SB, as shown in FIG. 9. Namely, the control circuit 311 (312) receives the signal SA (SB) and provides the signal SA' (SB') whose period consists of a first-level (high-level) interval corresponding to Y periods of the signal SA (SB) and a second-level (low-level) interval corresponding to Z periods of the signal SA (SB), where Y and Z are positive integers, respectively.

Figure 6:
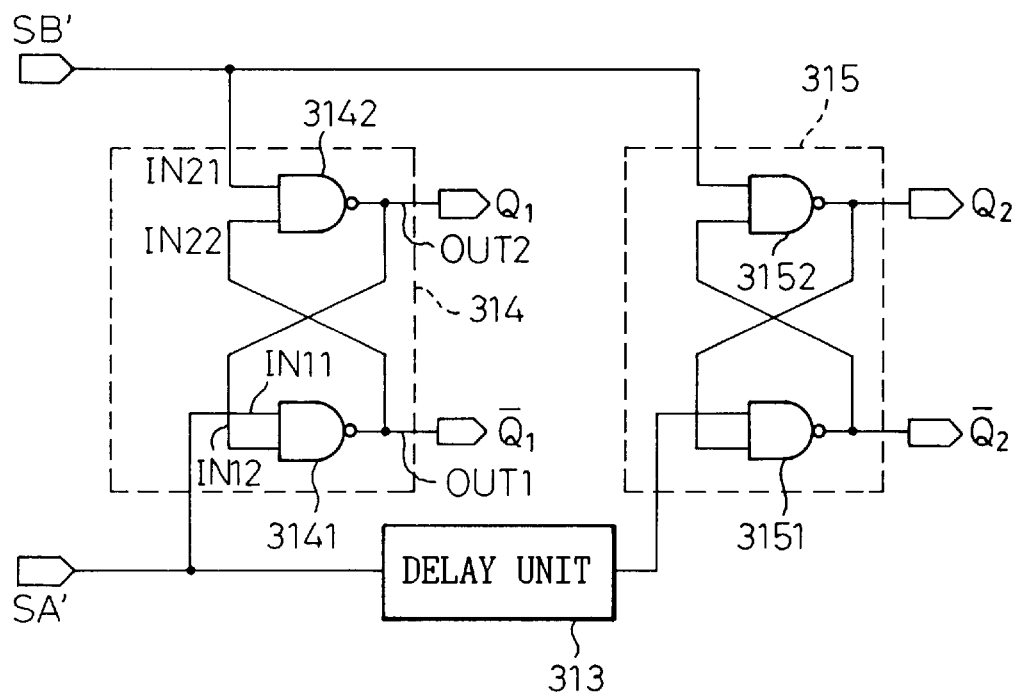
FIG. 6 is a block diagram showing a phase comparator unit of the phase comparator of FIG. 5.

FIG. 6 is a block diagram showing an example of the phase comparator unit 310 of FIG. 5.

The latch circuit 314 is an RS flip-flop consisting of NAND circuits 3141 and 3142. The latch circuit 315 is an RS flip-flop consisting of NAND circuits 3151 and 3152. The flip-flop 314 has a reset terminal to receive the signal SA' from the control circuit 311 and a set terminal to receive the signal SB' from the control circuit 312. The flip-flop 315 has a reset terminal to receive the signal SA' through the delay unit 313 and a set terminal to receive the signal SB' from the control circuit 312. The flip-flop 314 provides output signals Q1 and /Q1, and the flip-flop 315 provides output signals Q2 and /Q2. A combination of these output signals is used to determine a result of phase comparison.

In the flip-flop 314 (315), the NAND circuit 3141 (3151) has a first input end IN11 connected to the reset terminal of the flip-flop 314 (315) and a second input end IN12 connected to an output end OUT2 of the NAND circuit 3142 (3152) that provides the output signal Q1 (Q2). The NAND circuit 3142 (3152) has a first input end IN21 connected to the set terminal of the flip-flop 314 (315) and a second input end IN22 connected to an output end OUT1 of the NAND circuit 3141 (3151) that provides the inverted output signal /Q1 (/Q2).

Figure 7:
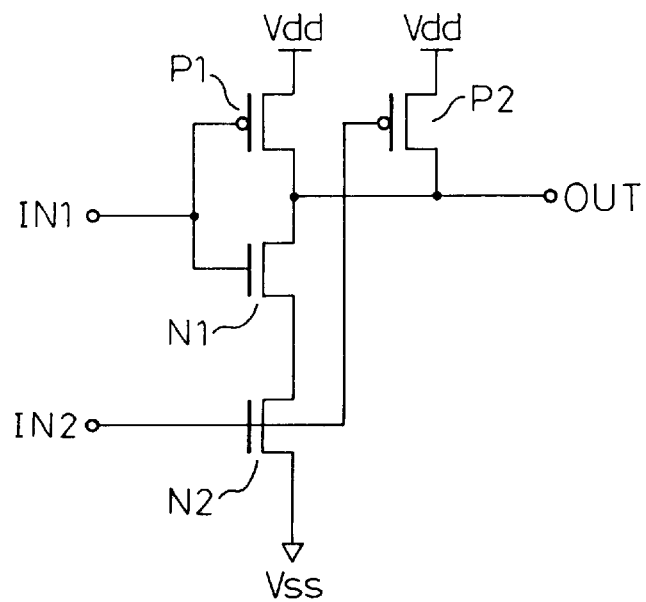
FIG. 7 is a circuit diagram showing a NAND circuit of the phase comparator unit of FIG. 6.

FIG. 7 is a circuit diagram showing an example of any one of the NAND circuits 3141, 3142, 3151, and 3152 of FIG. 6.

The NAND circuit consists of p-channel MOS transistors P1 and P2 and n-channel MOS transistors N1 and N2.

The transistor P1 has a source connected to a first power source line Vdd of high potential, a drain connected to the output end OUT of the NAND circuit, and a gate connected to the first input end IN1 of the NAND circuit. The transistor P2 has a source connected to the first power source line Vdd, a drain connected to the output end OUT, and a gate connected to the second input end IN2 of the NAND circuit.

The transistor N1 has a source connected to the drain of the transistor N2, a drain connected to the output end OUT, and a gate connected to the input end IN1. The transistor N2 has a source connected to a second power source line Vss of low potential and a gate connected to the input end IN2. The transistors P1, P2, N1, and N2 are not limited to the MOS (MIS) transistors. The structure of the phase comparator unit 310 is not limited to the one mentioned above.

In FIGS. 6 and 7, the signals to the set and reset terminals of the flip-flops 314 and 315 are properly set to reduce a fluctuation in the output signals Q1, /Q1, Q2, and /Q2 due to a change in the signals SA' and SB' and provide a correct phase comparison result of the signals SA' and SB'. Since two input signals to each NAND circuit are not completely symmetrical, the operation of the phase comparator unit 310 will fluctuate unless the input signals to the input ends IN1 and IN2 of the NAND circuit are properly defined.

Figure 8:
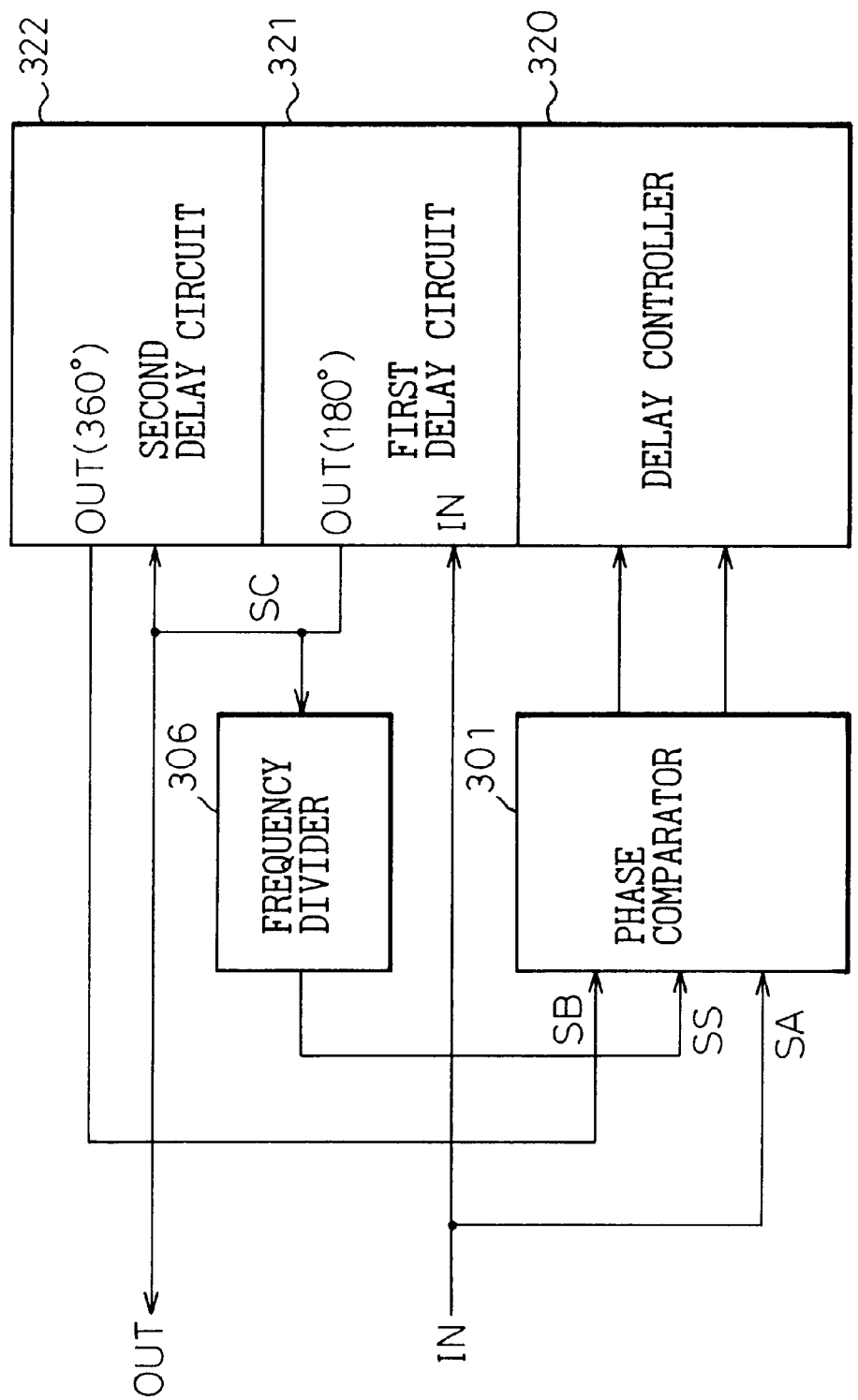
FIG. 8 is a block diagram showing a DLL circuit employing the phase comparator according to the present invention.

FIG. 8 is a block diagram showing a DLL circuit employing the phase comparator of the present invention. The DLL circuit has the phase comparator 301, a frequency divider 306, a delay controller 320, a first delay circuit 321, and a second delay circuit 322. An output signal SC from the first delay circuit 321 is supplied to the second delay circuit 322. An output signal SB from the second delay circuit 322 is synchronized with an input signal IN (SA). At this time, the output signal SC of the first delay circuit 321 is delayed behind the input signal IN by 180 degrees.

Proper conditions for a third signal SS employed by the phase comparator 301 will be considered with reference to FIG. 9.

FIG. 9 is a waveform diagram showing the operation of the phase comparator 301 of FIG. 8. A reference mark T indicates a period of the input signal IN (SA).

The input signal SA is passed through the first and second delay circuits 321 and 322 and becomes the signal SB, which lays the signal SA by the period T. The actual delay between the signals SA and SB is τ. The third signal SS is formed by shifting the signal SA by τ/N and by dividing the frequency of the signal SA by n (for example, 4). The third signal SS is provided by the frequency divider 306, and each period of the signal SS consists of a high-level interval corresponding to a period of the input signal SA and a low-level interval corresponding to three periods of the input signal SA. While the third signal SS is being at high level, rising edges of the signals SA and SB are detected by the phase comparator 301.

A rising edge of the signal SA indicated with a white dot in FIG. 9 is detectable when the following condition is met:

$$\tau/N<T \tag{1}$$

A rising edge of the signal SB indicated with a black dot in FIG. 9 is detectable when the following condition is met:

$$(1-1/N)\tau<T \tag{2}$$

According to the expressions (1) and (2), the value N for the widest range for detecting the rising edges of the signals SA and SB is as follows:

N=2 (corresponding to a phase shift of 180 degrees)

If τ<2T, the third signal SS can be used to divide the frequencies of the signals SA and SB at the same timing, to generate the signals SA' and SB'.

In the DLL circuit of FIG. 8, the signal SA is delayed by the first and second delay circuits 321 and 322 and becomes the signal SB. The delay between the signals SA and SB is designed to be a period of the signal SA and is actually τ. The signal SA is delayed by τ/N, i.e., τ/2 (180 degrees) to form the signal SC, and the frequency of the signal SC is divided by n (for example, 4) to form the third signal SS.

The phase comparator 301 uses the third signal SS to divide the frequencies of the signals SA and SB and compares the phases of the frequency-divided signals with each other. The phase comparator 301 may have the same structure as that of FIG. 5.

Figure 10:
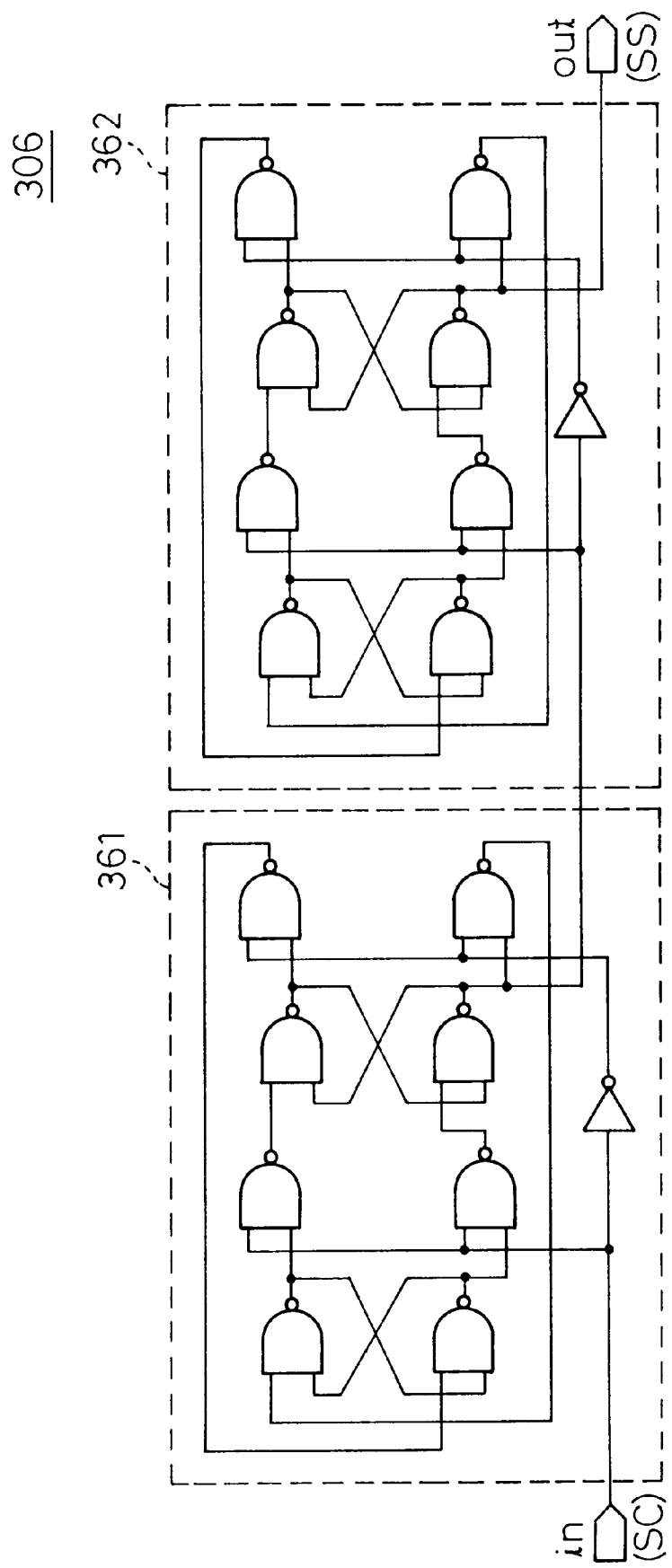
FIG. 10 is a circuit diagram showing a frequency divider of the DLL circuit of FIG. 8.

FIG. 10 is a circuit diagram showing an example of the frequency divider 306 of FIG. 8. The frequency divider 306 has two counters 361 and 362 each consisting of NAND gates and an inverter.

The frequency divider 306 has an input terminal to receive the signal SC that is delayed behind the signal SA by 180 degrees and an output terminal to provide the third signal SS of FIG. 9. The structure of the frequency divider 306 is not limited to the one shown in FIG. 10. It may be made of any combination of logic gates.

Figure 11:
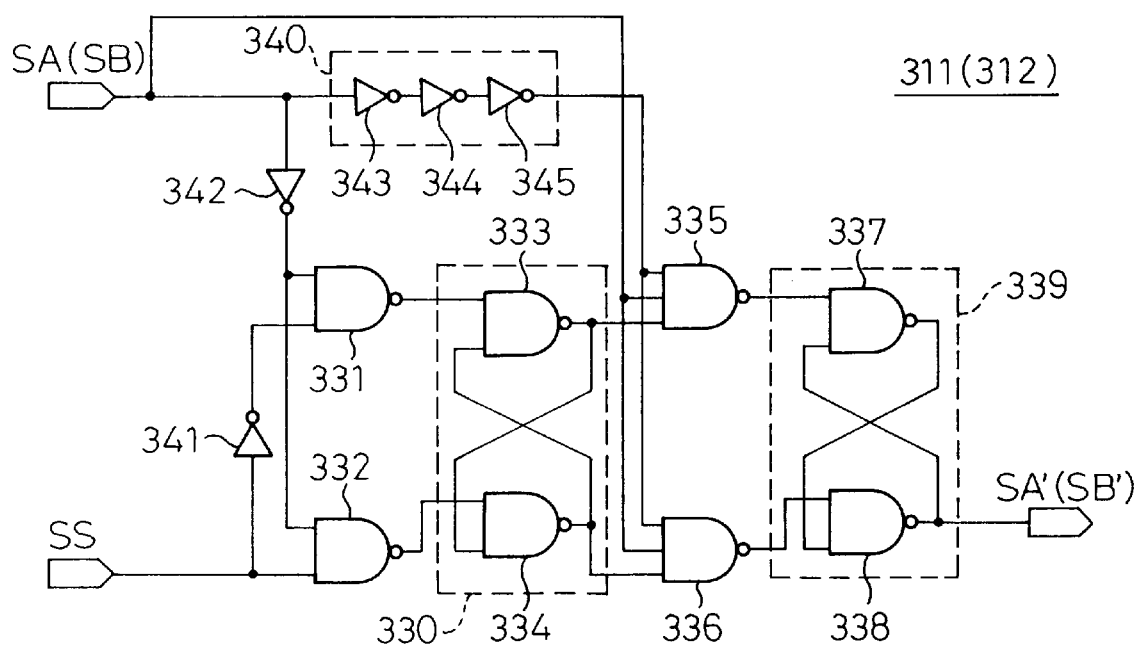
FIG. 11 is a circuit diagram showing an example of a control circuit provided in the phase comparator according to the present invention.

FIG. 11 is a circuit diagram showing an example of the control circuit 311 (312) of the phase comparator 301 of FIG. 5.

The control circuit 311 (312) receives the signal SA (SB) and the third signal SS, divides the frequency of the signal SA (SB) by, for example, 4 based on the signal SS, and provides the frequency-divided signal SA' (SB'). The control circuit 311 (312) has NAND circuits 331 to 338 and inverters 341 to 345. The signal SA is inverted by the inverter 342, and the inverted signal is supplied to the NAND circuits 331 and 332. At the same time, the signal SA is passed through a delay unit 340 consisting of the inverters 343 to 345 and supplied to the first input terminals of the 3-input NAND circuits 335 and 336. The third signal SS is supplied to the NAND circuit 332. At the same time, the third signal SS is inverted by the inverter 341, and the inverted signal is supplied to the NAND circuit 331. Also, the signal SA is directly supplied to the second input terminals of the 3-input NAND circuits 335 and 336.

The NAND circuits 333 and 334 form a first latch circuit 330 that holds the outputs of the NAND circuits 331 and 332. The outputs of the latch circuit 330 are supplied to the third input terminals of the 3-input NAND circuits 335 and 336, respectively. When the signal SA rises and when the output of the delay unit 340 is high, the 3-input NAND circuits 335 and 336 transfer the outputs of the latch circuit 330 to the NAND circuits 337 and 338 that form a second latch circuit 339. In this way, the frequency of the signal SA (SB) is divided based on the third signal SS, to provide the frequency-divided signal SA' (SB').

Namely, the signal SA (SB) is inverted by the inverter 342 whose output is used as a trigger to store the third signal SS in the latch circuit 330. Complementary signals stored in the latch circuit 330 are transferred to the latch circuit 339 in response to the signal SA. The data stored in the latch circuit 339 is provided as the frequency-divided signal SA' (SB').

Figure 12:
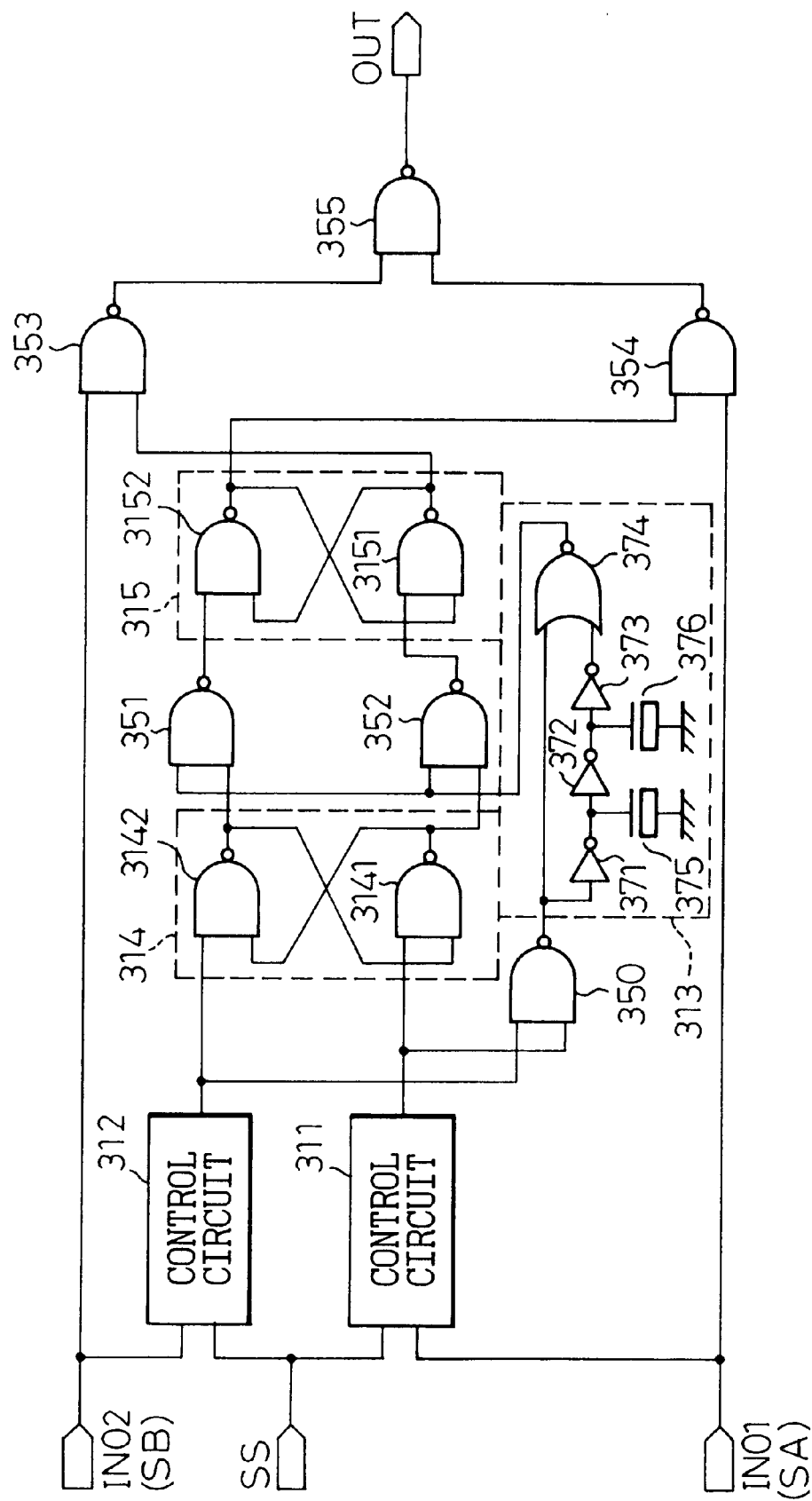
FIG. 12 is a block diagram showing another embodiment of a phase comparator according to the present invention.

FIG. 12 is a block diagram showing a phase comparator according to another embodiment of the present invention.

The circuit of FIG. 12 has NAND circuits 350 to 355 in addition to the control circuits 311 and 312, delay unit 313, and latch circuits 314 and 315 of FIGS. 5 and 6, to select one of signals SA and SB supplied to input terminals IN01 and IN02. A third signal SS is behind the signal SA by, for example, 120 degrees. The signal SA may be a 120-degree-delayed signal, and the signal SB may be an output signal of an input circuit (21). The delay unit 313 consists of cascaded inverters 371 to 373, capacitors 375 and 376, and a NOR circuit 374. The delay unit 313 provides a signal having a given pulse width, which is used to transfer complementary outputs of the latch circuit 314 to the latch circuit 315. The outputs of the latch circuit 315 select one of the NAND circuits 353 and 354, and one of the signals SA and SB is provided through the NAND circuit 355.

Figure 13A:
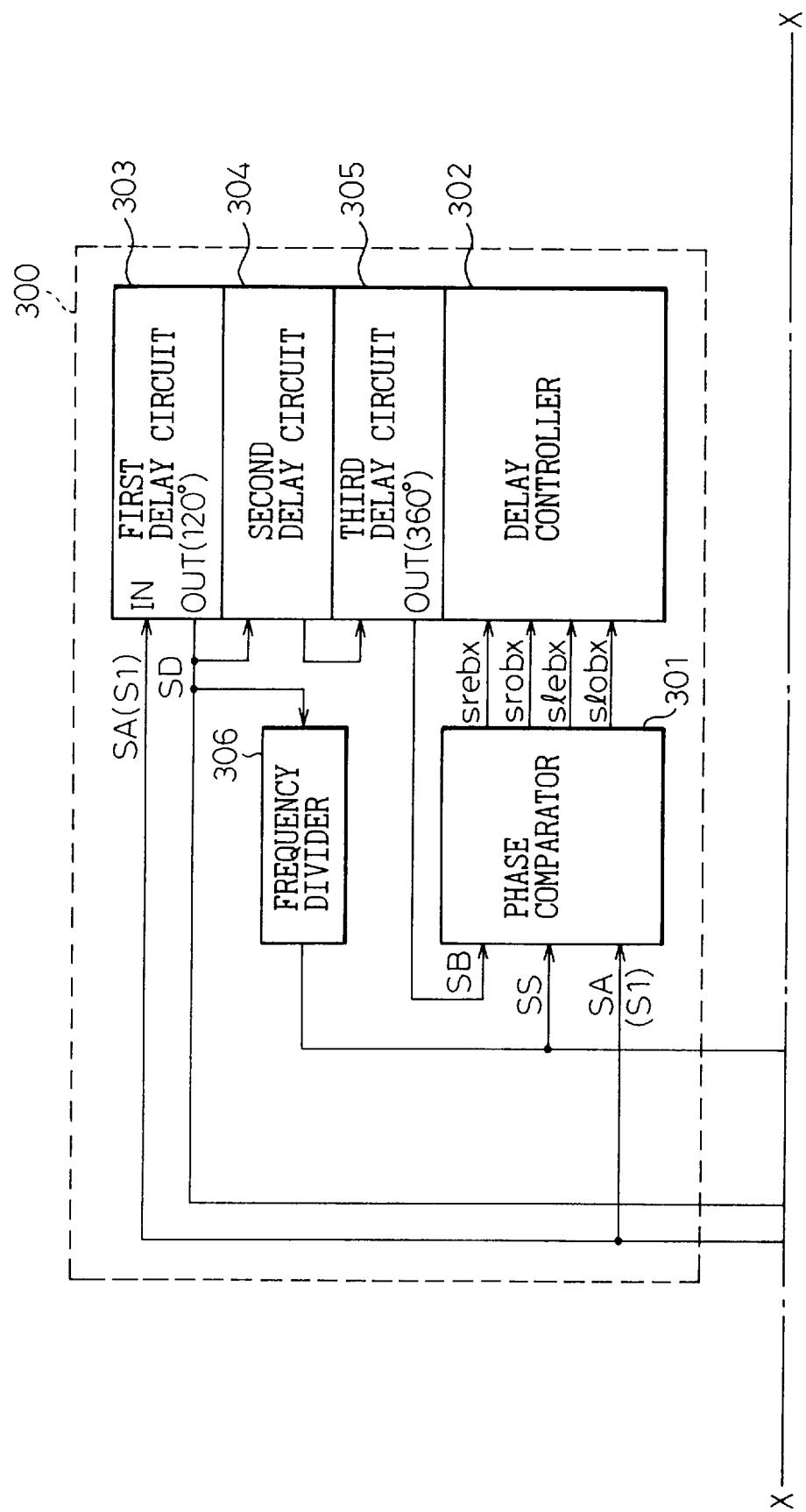
FIGS. 13A and 13B are block diagrams showing a semiconductor integrated circuit according to the present invention.
Figure 13B:
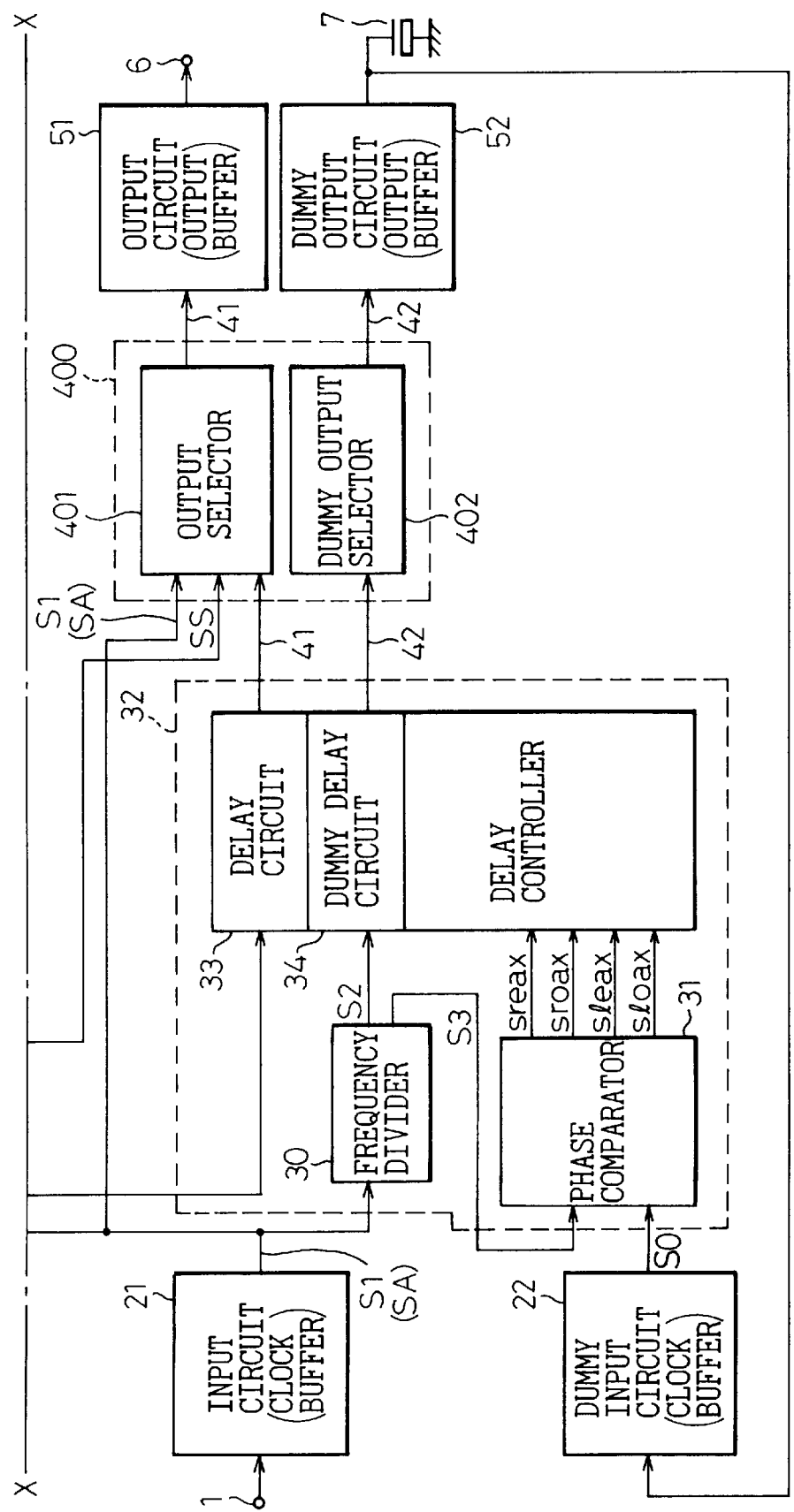

FIGS. 13A and 13B are block diagrams showing a semiconductor integrated circuit according to the present invention. The circuit includes a clock input pad 1, a clock buffer serving as an input circuit 21, a clock buffer serving as a dummy input circuit 22, a first DLL circuit 300, and a second DLL circuit 3. Also included are a clock signal line (real line) 41, a dummy line 42, an output buffer serving as an objective output circuit 51, an output buffer serving as a dummy output circuit 52, a data output pad 6, and a dummy load capacitor 7. The phase comparator of the present invention is applied to the first DLL circuit 300.

In FIG. 13A, the DLL circuit 300 has the phase comparator 301, a delay controller 302, a first delay circuit 303, a second delay circuit 304, a third delay circuit 305, and a frequency divider 306. The delay circuit 303 provides an output signal SD to the second delay circuit 304, whose output is supplied to the delay circuit 305. The delay circuit 305 provides an output signal SB, which is synchronized with an input signal SA (S1) corresponding to an external clock signal CLK supplied through the input circuit 21.

The output signal SD of the delay circuit 303 is behind the signal SA by 120 degree. The output signal of the delay circuit 304 is behind the signal SA by 240 degrees. The signal SB from the delay circuit 305 is behind the signal SA by 360 degrees. Namely, the signals SA and SB are synchronized with each other.

The frequency divider 306 receives the output signal SD from the delay circuit 303 and provides the third signal SS to the phase comparator 301. The third signal SS is also supplied to an output selector 401. The phase comparator 301 has the same structure as that of FIG. 5 and provides phase comparison result signals to the delay controller 302, which provides identical delay signals to the delay circuits 303 to 305.

In FIG. 13B, the DLL circuit 3 has a frequency divider 30, a phase comparator 31, a delay controller 32, a delay circuit 33, and a dummy delay circuit 34. The frequency divider 30 receives the signal S1 (SA) from the input circuit 21, divides the frequency thereof, and provides frequency-divided signals. Namely, the frequency divider 30 provides a first output signal S2 to the dummy delay circuit 34 and a second output signal S3 to the phase comparator 31. The signal S2 is passed through the dummy delay circuit 34, dummy line 42, dummy output selector 402, dummy output circuit 52, and dummy input circuit 22 and is supplied as a signal S0 to the phase comparator 31. The phase comparator 31 compares the phases of the signals S3 and S0 with each other and controls the delay controller 32 accordingly. The output signal of the delay circuit 33 is an output signal of the DLL circuit 3 and is supplied as a second control signal to the output selector 401 through the real line 41.

In response to the outputs of the phase comparator 31, the delay controller 32 provides identical delay signals to the delay circuit 33 and dummy delay circuit 34. As a result, the output circuit 51 provides an internal clock signal that has no apparent delay with respect to the external clock signal CLK even if there are input circuit 21, delay circuit 33, real line 41, output selector 401, and output circuit 51 between the external clock signal CLK and the internal clock signal.

In response to the third signal SS provided by the frequency divider 306 of the first DLL circuit 300, the output selector 401 selects one of the output signal S1 (SA) directly supplied from the input circuit 21 and the delayed signal from the delay circuit 33 of the second DLL circuit 3. The selected one is supplied to the output circuit 51. The output selector 401 is employed because it is preferable in some case to directly use the signal S1 from the input circuit 21 instead of the delayed signal from the delay circuit 33.

The present invention is applicable not only to memories such as SDRAMs but also to various semiconductor integrated circuits. The input signal IN (SA) supplied to the phase comparator of the present invention need not be only a clock signal but may also be any other signal.

As explained above in detail, the phase comparators of the present invention are applicable to DLL circuits and semiconductor integrated circuits that work on high-speed clock signals. The phase comparators correctly compare the phases of signals with each other and synchronize them, thereby ensuring a proper operation of objective elements of the DLL circuits and semiconductor integrated circuits.

FIGS. 14A to 14C show an example of a delay circuit 33, 34 (303, 304, 305; 321, 322) of a semiconductor integrated circuit according to the present invention, in which FIG. 14A shows a 1-bit delay element, FIG. 14B is a time chart showing the operation of the 1-bit delay element, and FIG. 14C shows cascaded 1-bit delay elements.

As shown in FIG. 14A, the 1-bit delay element has two NAND gates 401 and 402 and an inverter 403. An enable signal φE is high in FIG. 14B to activate the 1-bit delay element. The 1-bit delay element receives an input signal IN and a signal φN, which is an output signal of another 1-bit delay element on the right side, and provides an output signal OUT. Nodes 4a-1 and 4a-2 provide waveforms shown in FIG. 14B. The output signal OUT is a signal φN to another 1-bit delay element on the left side.

When the signal φN is at a low level "L" (low), the output signal OUT is always low. If the signal φN is at a high level "H" (high) and the signal φE is low, the output signal OUT is high. if the signal φN is high with the signal φE being high and the input signal IN being low, the output signal OUT is high, and with the input signal IN being high, the output signal OUT is low.

If the input signal IN rises with the enable signal φE being high, the input signal IN is transmitted through a path indicated with an arrow mark. If the enable signal φE is low, the input signal IN is blocked from the path.

In FIG. 14C, the 1-bit delay elements are cascaded to form the delay circuit. Although FIG. 14C shows only three 1-bit delay elements, many elements are cascaded in reality, and each element is provided with a signal line such as φE-1, φE-2, or φE-3 each for transmitting an enable signal φE. These enable signals are controlled by a delay control circuit (32; 302; 320).

In FIG. 14C, the enable signal φE-2 is high to activate the center 1-bit delay element. If the input signal IN changes from low to high, the NAND gates 401-1 and 401-3 of the left and right 1-bit delay elements block the input signal IN because their enable signals φE-1 and φE-3 are each low.

On the other hand, the NAND gate 401-2 of the center 1-bit delay element passes the input signal IN because its enable signal φE-2 is high. The NAND gate 402-2 thereof also passes the input signal IN because the output signal OUT (φN) of the right 1-bit delay element is high. Then, the center 1-bit delay element provides the output signal OUT of low. If the output signal OUT (φN) of the right 1-bit delay element is low, the output signal OUT of the 1-bit delay element that receives the output signal is always low. Accordingly, the output signal OUT of the center 1-bit delay element is transmitted through the NAND gate and inverter of the left 1-bit delay element and is provided as a final output signal.

In this way, the input signal IN is transmitted through an activated 1-bit delay element, to form a final output signal. Namely, controlling the enable signal φE of a required 1-bit delay element to high will control a delay in the delay controller. The delay of a 1-bit delay element is determined by the total signal propagation time of the NAND gates and inverter of the element and forms a unit delay time. A total delay time is calculated by multiplying the number of 1-bit delay elements passed by the input signal IN by the unit delay time.

Figure 15:
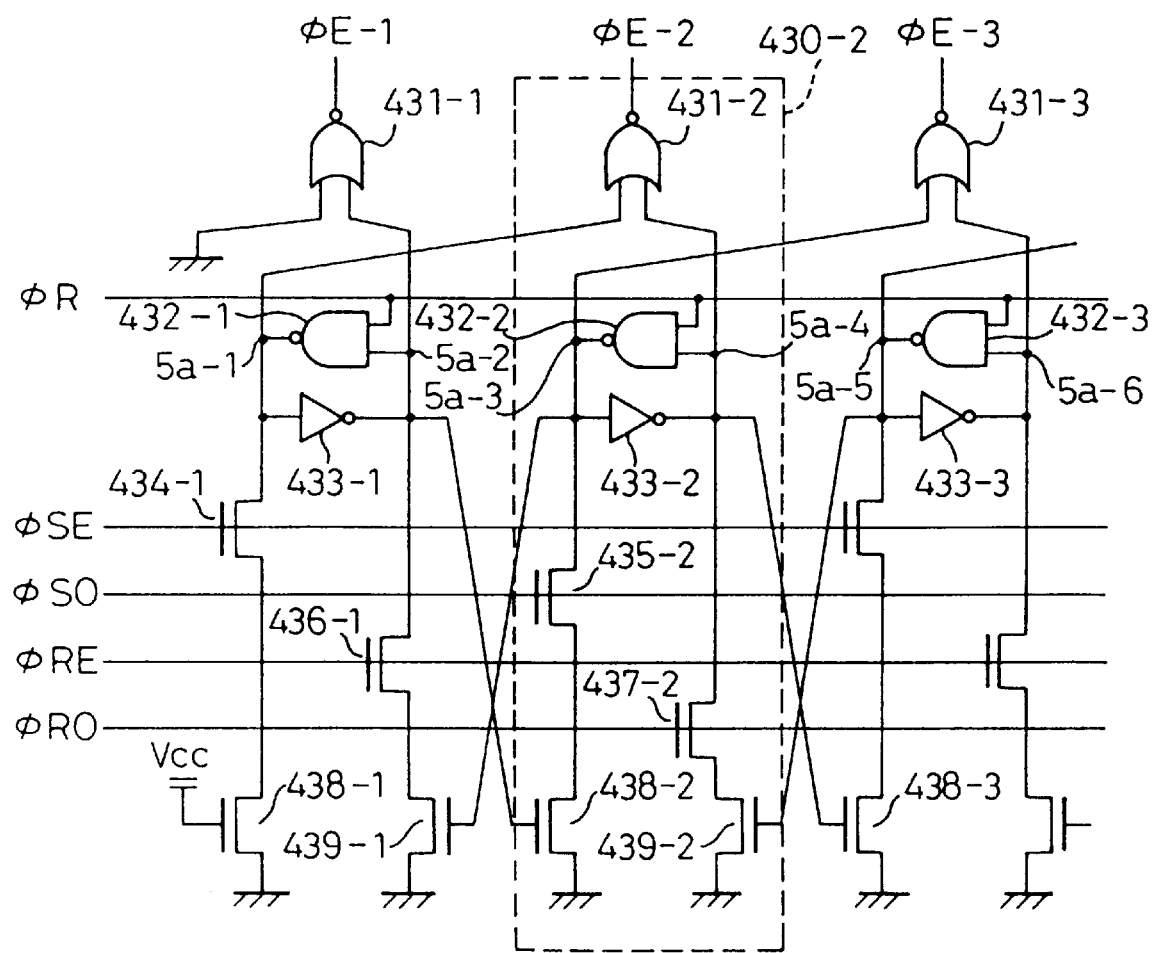
FIG. 15 is a circuit diagram showing an example of a delay control circuit of a semiconductor integrated circuit according to the present invention.

FIG. 15 shows an example of a delay control circuit of a semiconductor integrated circuit according to the present invention.

The delay control circuit comprises of 1-bit control elements among which one surrounded with a dotted line in FIG. 15 is a 1-bit control element 430-2. Each element provides an enable signal φE to a corresponding one of the 1-bit delay elements.

The 1-bit control element 430-2 comprises of a flip-flop having a NAND gate 432-2 and an inverter 433-2, transistors 435-2, 437-2, 438-2, and 439-2, and a NOR gate 431-2. The gate of the transistor 438-2 is connected to a node 5a-2 of a front 1-bit control element. The gate of the transistor 439-2 is connected to a node 5a-5 of a rear 1-bit control element. Incremental signals, i.e., set signals φSE and φS0 and decremental signals, i.e., reset signals φRE and φRO are connected alternately to the 1-bit control elements.

In the center 1-bit control element 430-2, the gate of the transistor 435-2 receives the set signal φS0, and the gate of the transistor 437-2 receives the reset signal φRO. The gates of the corresponding transistors of the front and rear 1-bit control elements receive the set signal φSE and reset signal φRE. The NOR gate 431-2 receives a signal from a node 5a-1 of the front element and a signal from a node 5a-4 of its own. A signal φR resets the delay controller. The signal φR is once set to low when a power source is turned on and is fixed to high thereafter.

Figure 16:
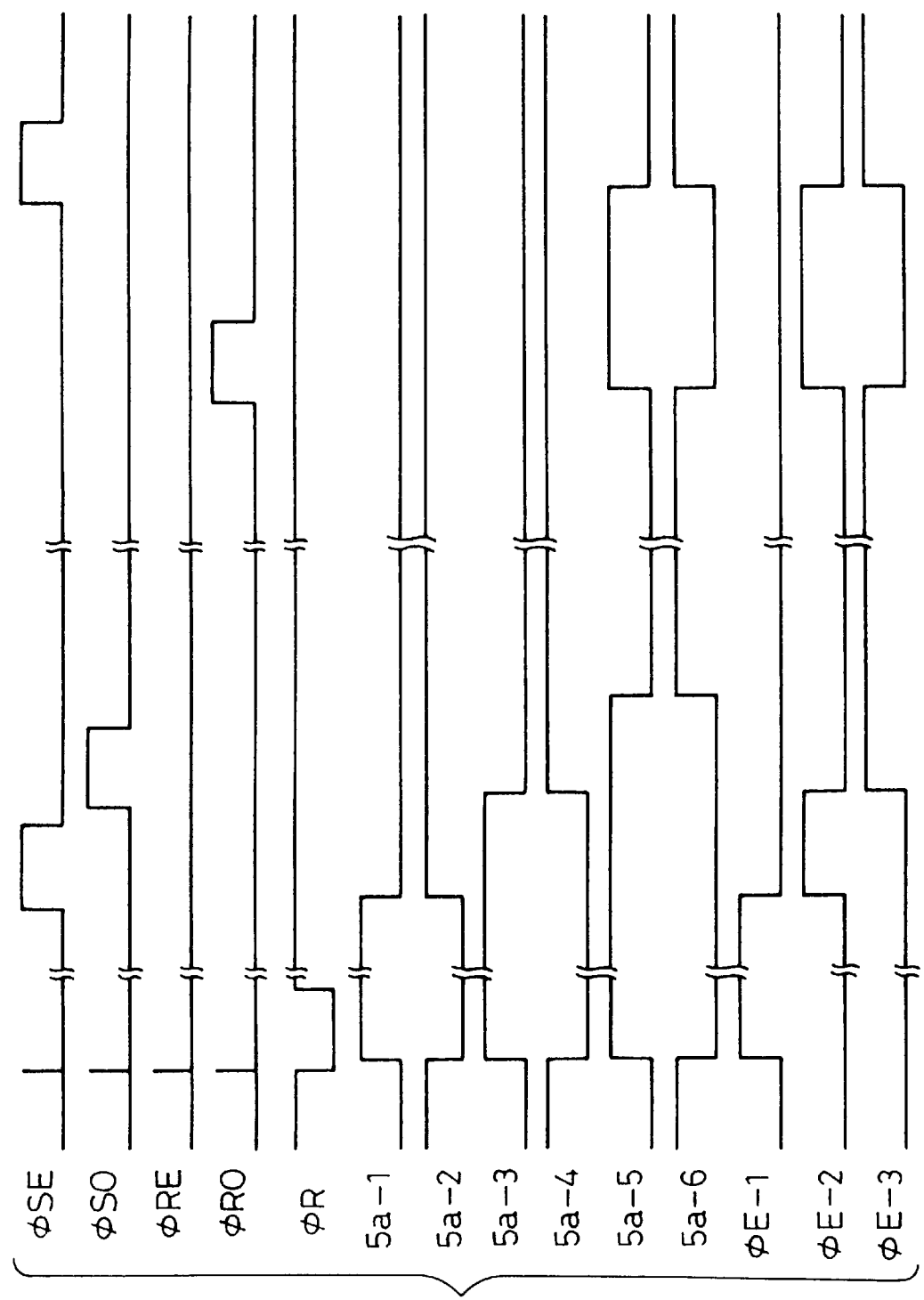
FIG. 16 is a timing chart showing an operation of the delay control circuit of FIG. 15.

FIG. 16 is a timing chart showing the operation of the circuit of FIG. 15.

The reset signal φR is once set to low so that the nodes 5a-1, 5a-3, and 5a-5 are set to high and the nodes 5a-2, 5a-4, and 5a-6 to low. To carry out an incremental operation, the incremental signals, i.e., the set signals φSE and φS0 are set to high and low alternately.

When the set signal JSE is changed from low to high, the node 5a-1 is grounded to low, and the node 5a-2 is changed to high. Accordingly, the enable signal φE-1 changes from high to low. This state is latched by the flip-flop, and therefore, the enable signal φE-1 keeps the low level even if the set signal tSE returns to low. When the node 5a-1 changes to low, the enable signal φE-2 changes from low to high. When the node 5a-2 changes to high, the transistor 438-2 is turned on. When the set signal φS0 changes from low to high, the node 5a-3 is grounded to low, and the node 5a-4 changes to high. As a result, the enable signal φE-2 changes from high to low. This state is latched by the flip-flop, and therefore, the enable signal φE-2 keeps the low level even if the set signal φS0 returns to low.

When the node 5a-3 changes to low, the enable signal φE-3 changes from low to high. Although FIG. 16 shows each one pulse of the set signals φSE and φS0, many 1-bit control elements are connected to one another in reality. Accordingly, if the set signals φSE and φS0 are alternately set to high and low, the 1-bit control element that provides the enable signal φE of high level will shift to the right sequentially. If the comparison result from the phase comparator 31 indicates that a delay must be increased, the set signals φSE and φS0 will alternately be set to high and low.

When the incremental (set) signals φSE and φS0 and decremental (reset) signals φRE and φRO are kept low, a fixed 1-bit control element will provide an enable signal φE of high level. Accordingly, if the comparison result from the phase comparator 31 indicates to keep a delay, the signals φSE, φS0, φRE, and φRO are held low.

When carrying out a decremental operation, the reset signals φRE and φRO are alternately provided so that the 1-bit control element that provides the enable signal φE of high level may shift to the left sequentially.

In this way, the delay control circuit of FIG. 15 shifts the 1-bit control element that provides an enable signal φE of high level element by element, to control the 1-bit delay elements of FIG. 14C element by element.

Figure 17:
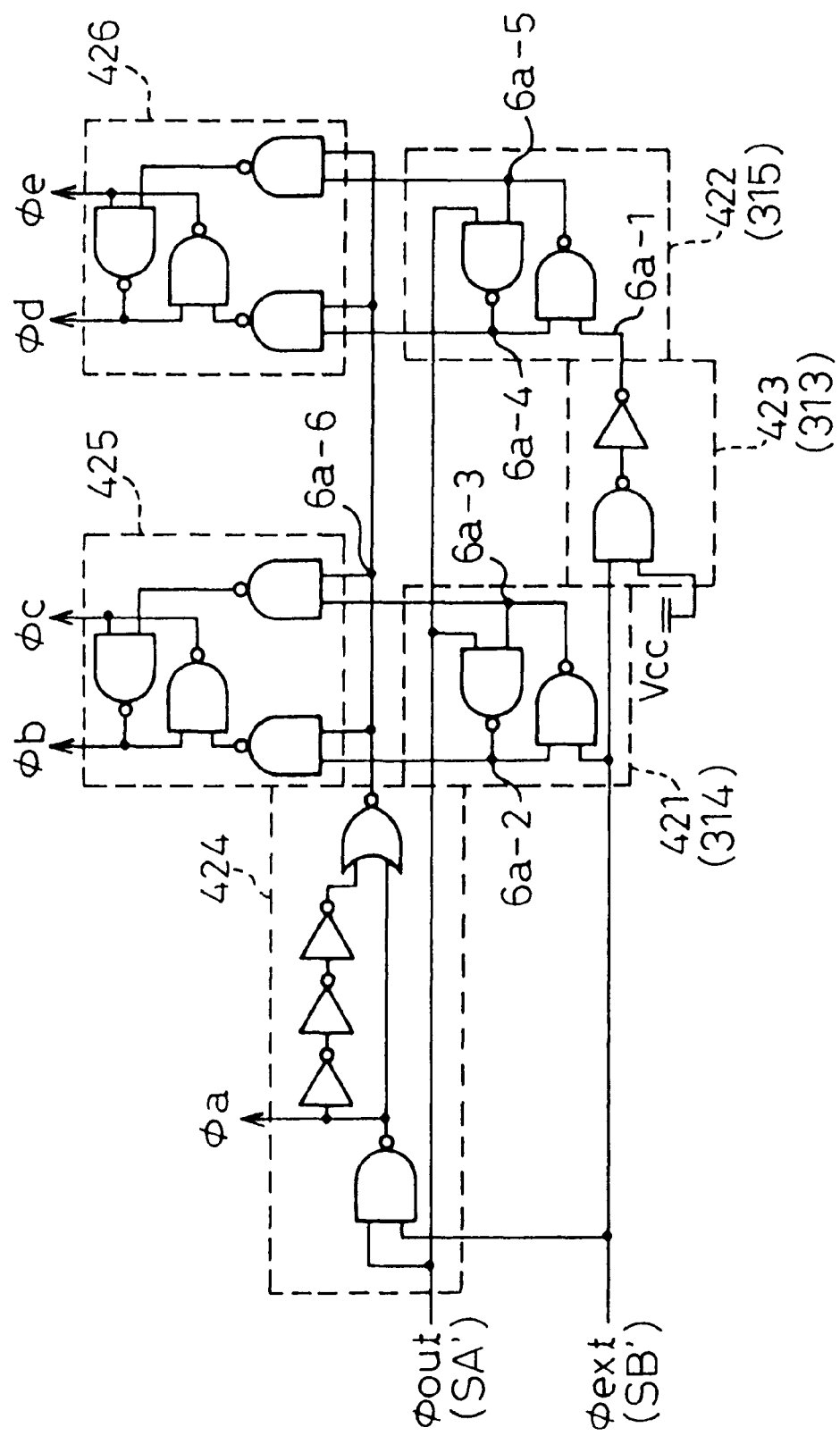
FIG. 17 is a circuit diagram showing an example of a phase comparator (phase comparing section) of a semiconductor integrated circuit according to the present invention.

FIG. 17 shows a phase comparator (phase comparing section) of a semiconductor integrated circuit according to the present invention, and FIGS. 18A to 18C are timing charts showing the operation of the phase comparator.

Figure 19:
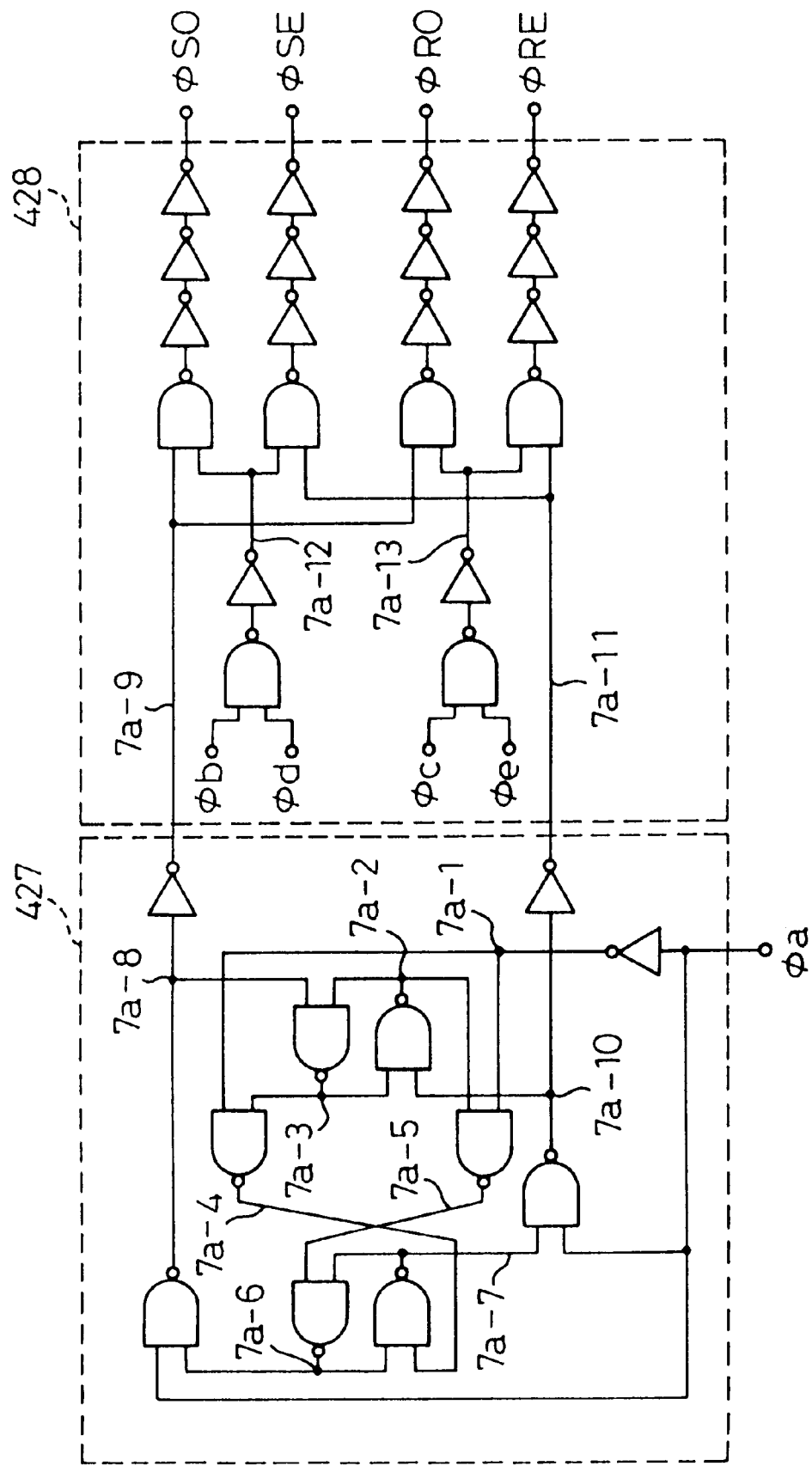
FIG. 19 is a circuit diagram showing an example of a phase comparator (amplifying section) of a semiconductor integrated circuit according to the present invention.

The phase comparator (31; 301) comprises the phase comparing section of FIG. 17 and an amplifying section of FIG. 19.

In FIG. 17, references φout and φext denote an output signal and an external clock signal, and these signals φout and φext are compared by the phase comparator. Namely, the phase of the signal rout is compared by the signal φext as a reference signal. Further, references φa to φe denote output signals transferred to the amplifying section. Note that, in the phase comparator 301 of the DLL circuit 300 shown in FIG. 8 or FIGS. 13A and 13B, the output signal rout corresponds to the output signal SA' of the control circuit 311, and the external clock signal text corresponds to the output signal SB' of the control circuit 312, as shown in FIG. 5. Namely, as shown in FIG. 5, in the phase comparator 301, the first and second control circuits 311 and 312 are additionally provided, where the first control circuit 311 receives the first signal SA (φout) and third signal SS and the second control circuit 312 receives the second signal SB (φext) and third signal SS, respectively. Further, in the phase comparing section of FIG. 17, a flip-flop circuit 421 corresponds to the latch circuit 314 of FIG. 5, a flip-flop circuit 422 corresponds to the latch circuit 315 of FIG. 5, and a delay circuit 423 corresponds to the delay unit 313 of FIG. 5, respectively.

As shown in FIG. 17, the phase comparing section of the phase comparator 31 (301) is composed of flip-flops 421 and 422 each having two NAND gates, latches 425 and 426 for latching the states of the flip-flops 421 and 422, respectively, a generator 424 for generating an activation signal for the latches 425 and 426, and a 1-delay circuit 423 for obtaining a phase allowance for the external clock signal φext.

FIG. 18A shows that the phase of the dummy internal clock signal φout is ahead of the phase of the reference signal φext. Namely, the signal φout changes from low to high before the signal φext shows the same change. When the signals φout and φext are each at low level, nodes 6a-2 to 6a-5 of the flip-flops 421 and 422 are each high. When the signal φout changes from low to high, the nodes 6a-2 and 6a-4 change from high to low. Thereafter, the signal φext changes from low to high, and after one unit delay, the node 6a-1 changes from low to high. In spite of these changes, the terminal voltages of the flip-flops 421 and 422 are unchanged because they are already fixed. As a result, the node 6a-2 is continuously low, 6a-3 high, 6a-4 low, and 6a-5 high.

When the signal text changes from low to high, the output signal φa of the generator 424 changes from high to low, to apply a high pulse to the node 6a-6. Since the node 6a-6 is connected to the NAND gates of the latches 425 and 426, the NAND gates are temporarily activated, and the latches 425 and 426 latch the terminal voltages of the flip-flops 421 and 422. As a result, the output signal φb changes to high, φc to low, φd to high, and φe to low.

FIG. 18B shows that the dummy internal clock signal φout and reference signal φext have substantially the same phase and change from low to high substantially at the same time. Within a time difference between a rise of the signal φout and a rise of the node 6a-1, the signal φout changes from low to high. At this time, the signal φext changes from low to high, so that the node 6a-3 of the flip-flop 421 changes from high to low. In the flip-flop 422, the node 6a-1 maintains low level, and the node 6a-4 changes from high to low. Thereafter, the node 6a-1 changes from low to high. At this time, the state of the flip-flop 422 is unchanged. The node 6a-6 provides a high pulse, and the latches 425 and 426 store the states. As a result, the output signal φb changes to low, φc to high, φd to high, and be to low.

FIG. 18C shows that the phase of the dummy internal clock signal φout is behind the phase of the reference signal φext and that the signal φout changes from low to high after the same change in the signal φext. In this case, the signal φext causes changes in the flip-flops 421 and 422, and the nodes 6a-3 and 6a-5 change from high to low. As a result, the output signal φb changes to low, φc to high, id to low, and φe to high.

In this way, a rise of the reference signal φext is used to determine whether a rise of the dummy internal clock signal φout is ahead, simultaneous, or behind. The determination is latched as values of the output signals φb, φc, φd, and φe. According to these values, it is determined to increment or decrement delays in the delay controllers.

Figure 20:
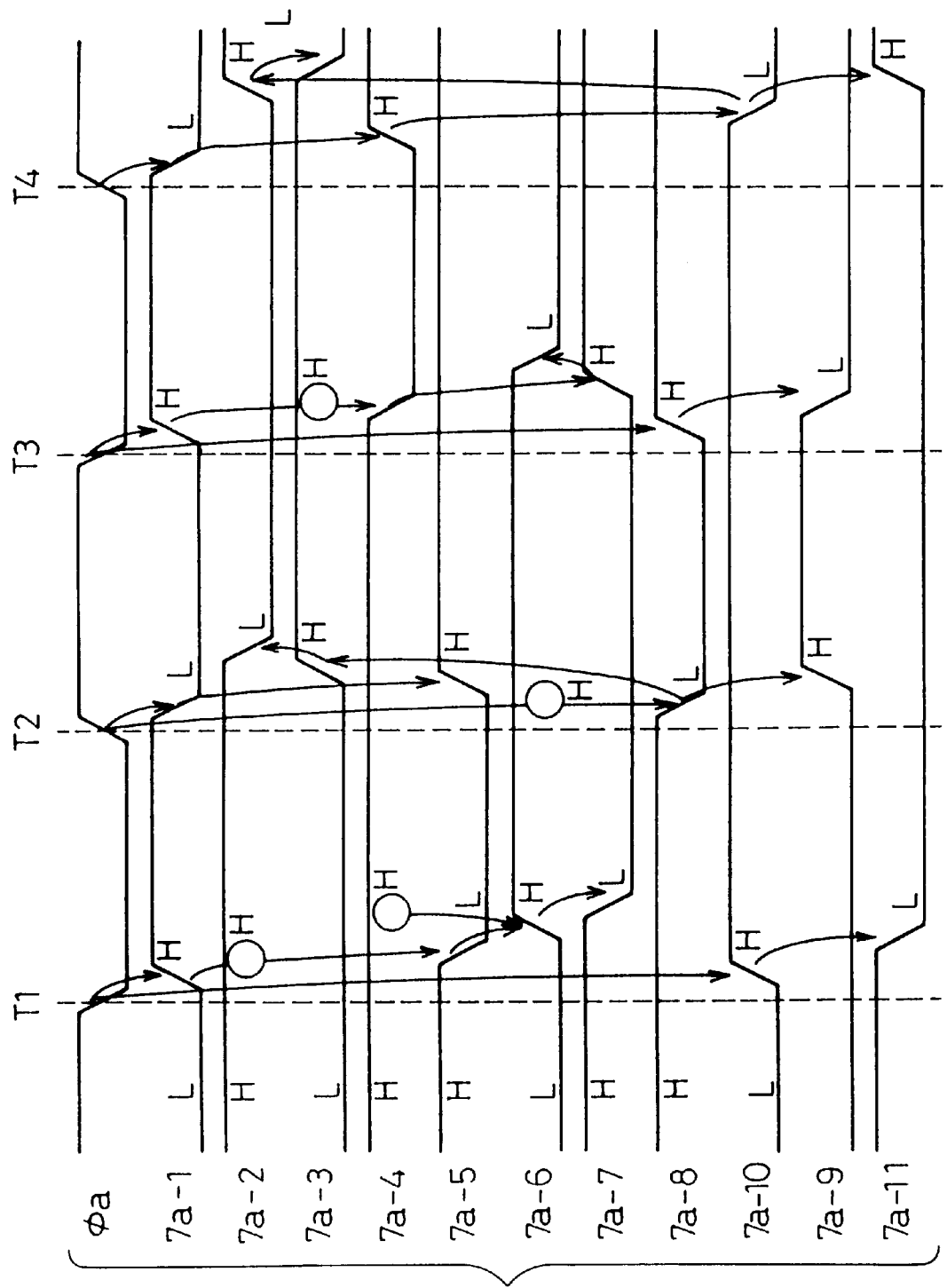
FIG. 20 is a timing chart showing an operation of a JK flip-flop of the amplifying section of FIG. 19.

FIG. 19 shows the amplifying section of the phase comparator 31 of the present invention, and FIG. 20 is a timing chart showing the operation of a JK flip-flop of the amplifying section.

The amplifying section has the JK flip-flop 427 and an amplifier 428 consisting of NAND gates and inverters. The JK flip-flop 427 receives the output signal φa from the phase comparing section of FIG. 17. In response to the level of the signal φa, the voltages of nodes 7a-9 and 7a-11 alternate between high and low levels. The amplifier 428 receives and amplifies the outputs of the JK flip-flop 427 and the signals φb to φe.

The operation of the JK flip-flop 427 will be explained with reference to the timing chart of FIG. 20. The signal φa changes from high to low at time T1, and then, nodes 7a-1 and 7a-10 change from low to high. Nodes 7a-5, 7a-6, and 7a-7 change in response to the change at the node 7a-1, but a node 7a-8 shows no change because the signal φa is low. As a result, the output node 7a-9 is unchanged, and the output node 7a-11 changes from high to low. At time T2, the signal φa changes from low to high, and then, the node 7a-8 changes from high to low. The node 7a-10 is unchanged because the node 7a-7 is unchanged. The output node 7a-9 changes from low to high, and the output node 7a-11 is unchanged. In this way, the output nodes 7a-9 and 7a-11 of the JK flip-flop 427 alternately change from high to low and from low to high.

Figure 21:
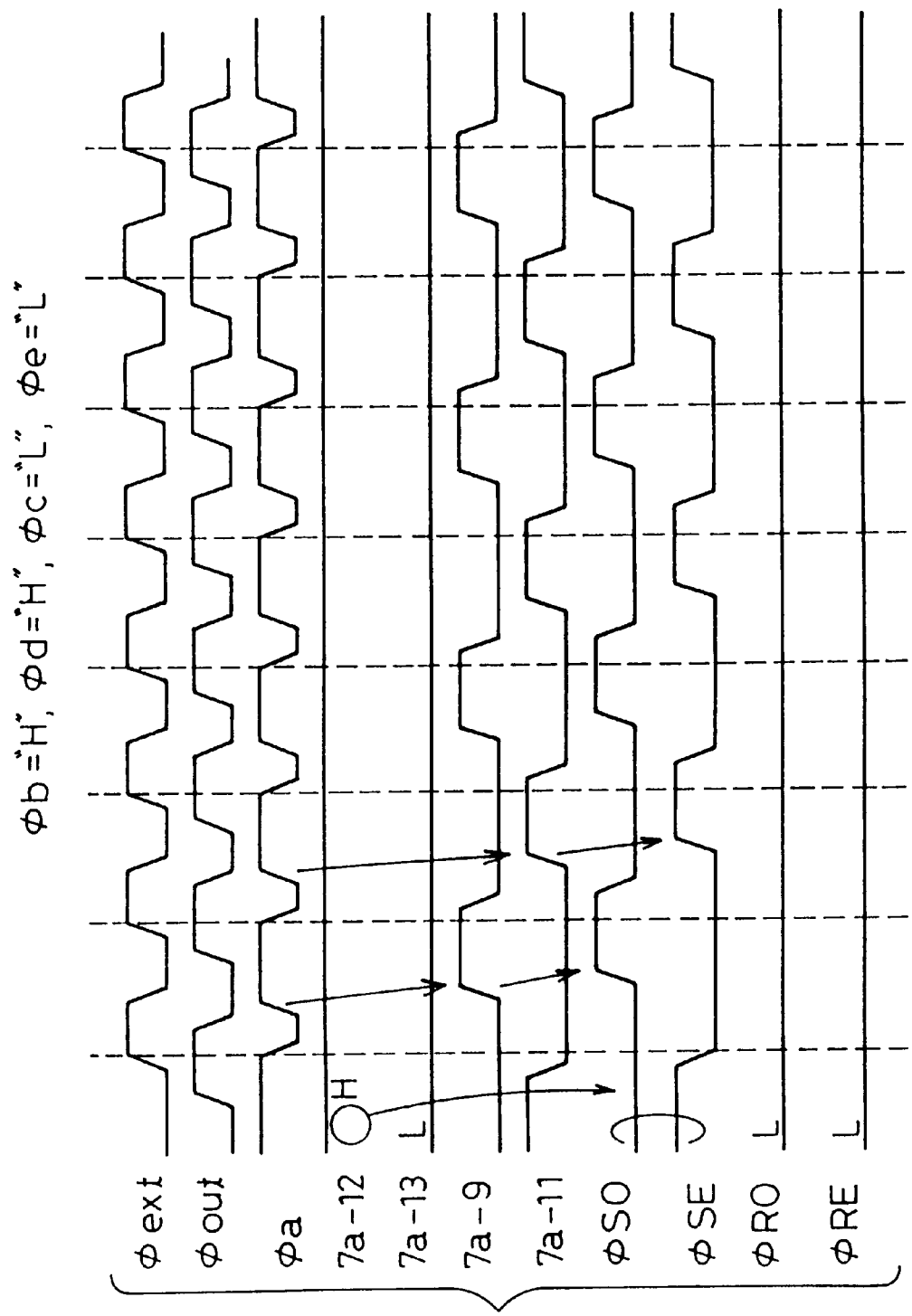
FIG. 21 is a timing chart showing an incremental operation of the amplifying section of FIG. 19.
Figure 22:
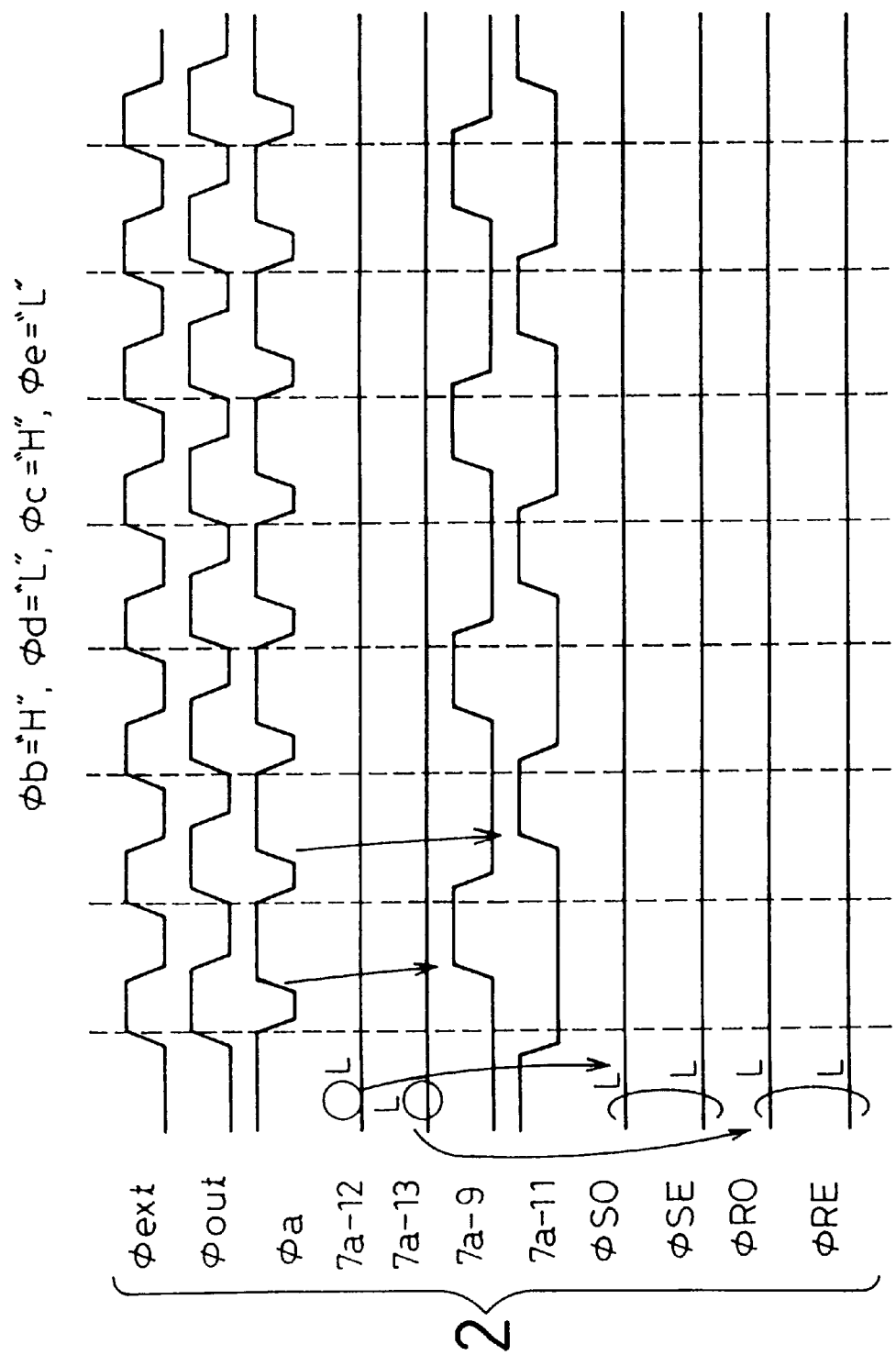
FIG. 22 is a timing chart showing a sustain operation of the amplifying section of FIG. 19.
Figure 23:
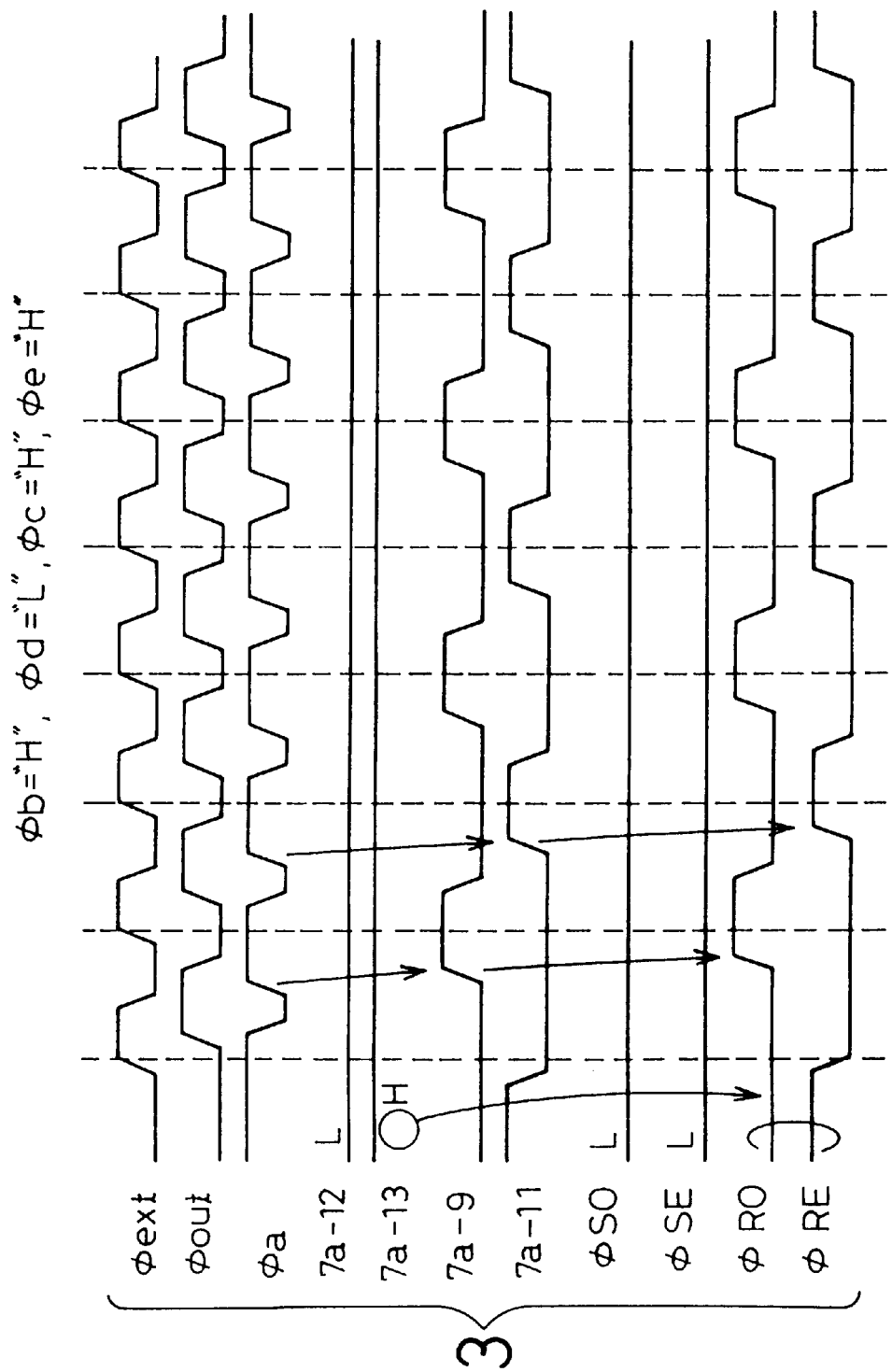
FIG. 23 is a timing chart showing a decremental operation of the amplifying section of FIG. 19.

FIG. 21 is a timing chart showing an incremental operation of the amplifying section of FIG. 19 of the phase comparator, FIG. 22 is a timing chart showing a sustain operation of the same, and FIG. 23 is a timing chart showing a decremental operation of the same.

In FIG. 21, the dummy internal clock signal φout changes from low to high before the same change in the reference signal φext. In this case, the phase comparing section provides the signal φb of high, φc of low, φd of high, and φe of low. As a result, a node 7a-12 becomes high, and a node 7a-13 is fixed at low. Although the incremental (set) signals φS0 and φSE change in response to the state of the JK flip-flop 427, the decremental (reset) signals φRO and φRE are unchanged because the node 7a-13 is low.

In FIG. 22, the signal φout changes from low to high substantially simultaneously with the reference signal φext. In this case, the phase comparing section provides the signal φb of low, φc of high, φd of high, and φe of low. As a result, the nodes 7a-12 and 7a-13 are fixed at low. The set signals φS0 and φSE are not influenced by the output of the JK flip-flop, and therefore, the signals φS0, φSE, φRO, and φRE are fixed at low.

In FIG. 23, the signal φout changes from low to high behind the same change in the reference signal φext. In this case, the phase comparing section of FIG. 17 provides the signal φb of low, φc of high, φd of low, and φe of high. As a result, the node 7a-12 is fixed at low, the node 7a-13 is fixed at high, the reset signals φRO and φRE change in response to the state of the JK flip-flop, and the set signals φS0 and φSE are unchanged because the node 7a-12 is low.

Figure 24:
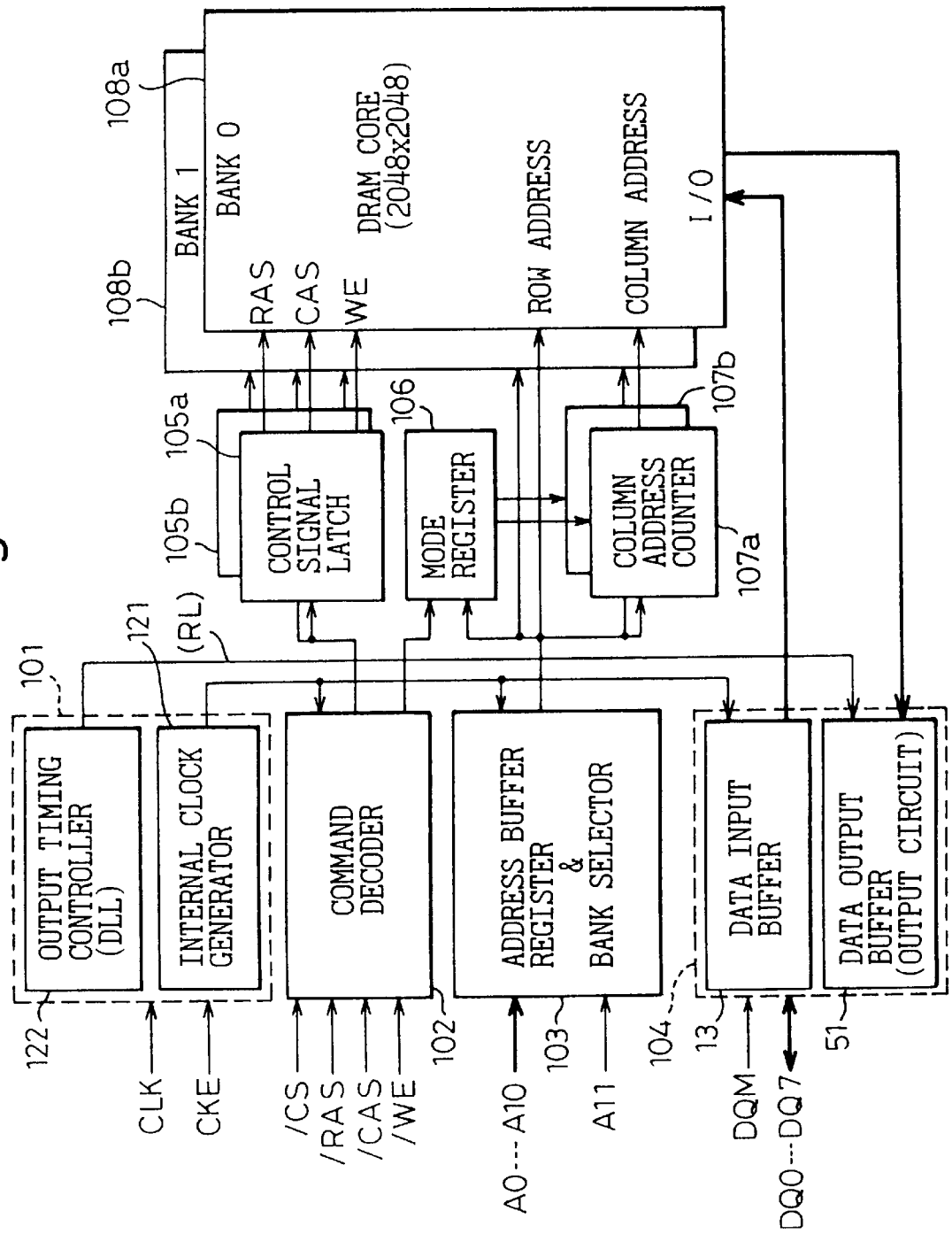
FIG. 24 is a block diagram showing a synchronous DRAM as an example of the semiconductor integrated circuit according to the present invention.
Figure 25:
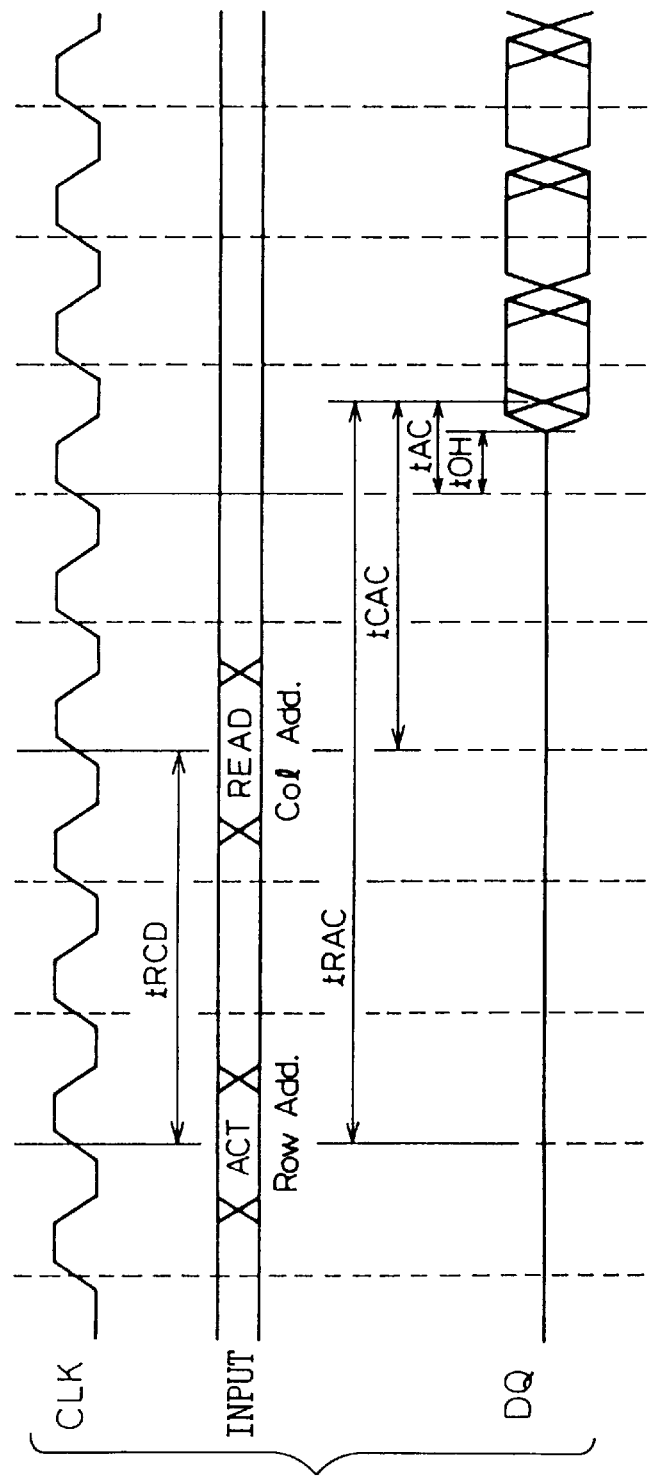
FIG. 25 is a timing chart showing an operation of the synchronous DRAM of FIG. 24.

FIG. 24 shows an SDRAM according to the present invention, and FIG. 25 is a timing chart showing the operation of the SDRAM.

The SDRAM employs a pipeline method and is a 2-bank, 6-bit, 16-M SDRAM.

The SDRAM has DRAM cores 108*a* and 108*b*, a clock buffer 101, a command decoder 102, an address buffer/register and bank address selector 103, an I/O data buffer/register 104, control signal latches 105*a* and 105*b*, a mode register 106, and column address counters 107*a* and 107*b*. Signals /CS, /RAS, /CAS, and /WE are combined to form a command that specifies an operation mode. The command is decoded by the command decoder 102, and according to a mode specified by the command, circuits are controlled. The signals /CS, /RAS, /CAS, and /WE are also supplied to the latches 105*a* and 105*b* that maintain their states until the φext command is provided.

Address signals are amplified by the address buffer 103, which provides row addresses for the banks as well as initial addresses for the column address counters 107*a* and 107*b*.

The clock buffer 101 has an internal clock generator 121 and an output timing controller 122, which is the DLL circuit of the present invention. The internal clock generator 121 generates an ordinary internal clock signal according to an external clock signal CLK. The output timing controller 122 generates a delay-locked (phase-locked) clock signal after carrying out the delay control of the present invention mentioned above.

The register 104 has a data input buffer 13 and a data output circuit 51. The data output circuit 51 amplifies data read out of the DRAM cores 108*a* and 108*b* and provides the data through output pads DQ0 to DQ7 according to the delay-locked clock signal provided by the output timing controller 122. Input data to the pads DQ0 to DQ7 are received by the data input buffer 13. A real line (RL) runs between the output timing controller 122 and the data output circuit 51.

FIG. 25 shows a read operation of the SDRAM of FIG. 24.

The external clock signal CLK is supplied from a system to the SDRAM. In synchronization with a rise of the clock signal CLK, the SDRAM reads commands, address signals, and input data and provides output data.

When reading data out of the SDRAM, the command signals /CS, /RAS, /CAS, and /WE are combined to form an active command (ACT), which is supplied to a command terminal. At the same time, a row address signal is supplied to an address terminal. Then, the SDRAM is activated to select a word line corresponding to the row address, provides corresponding cell data to a corresponding bit line, and amplifies the data by a sense amplifier.

After an operation time tRCD related to the row address, a read command and a column address are supplied to the SDRAM. The SDRAM selects sense amplifier data according to the column address, supplies the data to a data bus line, amplifies the data by a data bus amplifier, further amplifies the data by the output buffer, and transfers the data to the output terminal DQ. These operations are the same as those of a standard DRAM. In the SDRAM, circuits related to a column address carry out a pipeline operation, and read data is continuously provided. Accordingly, a data transfer speed is determined by the period of the external clock signal.

The SDRAM involves three kinds of access time each of which is defined according to a rise of the clock signal CLK. In FIG. 25, there are row address access time tRAC, column address access time tCAC, and clock signal access time tAC.

When the SDRAM is used in a high-speed memory system, tRAC and tCAC are important because they determine a period between command input and first data output. The clock signal access time tAC is also important.

Figure 26:
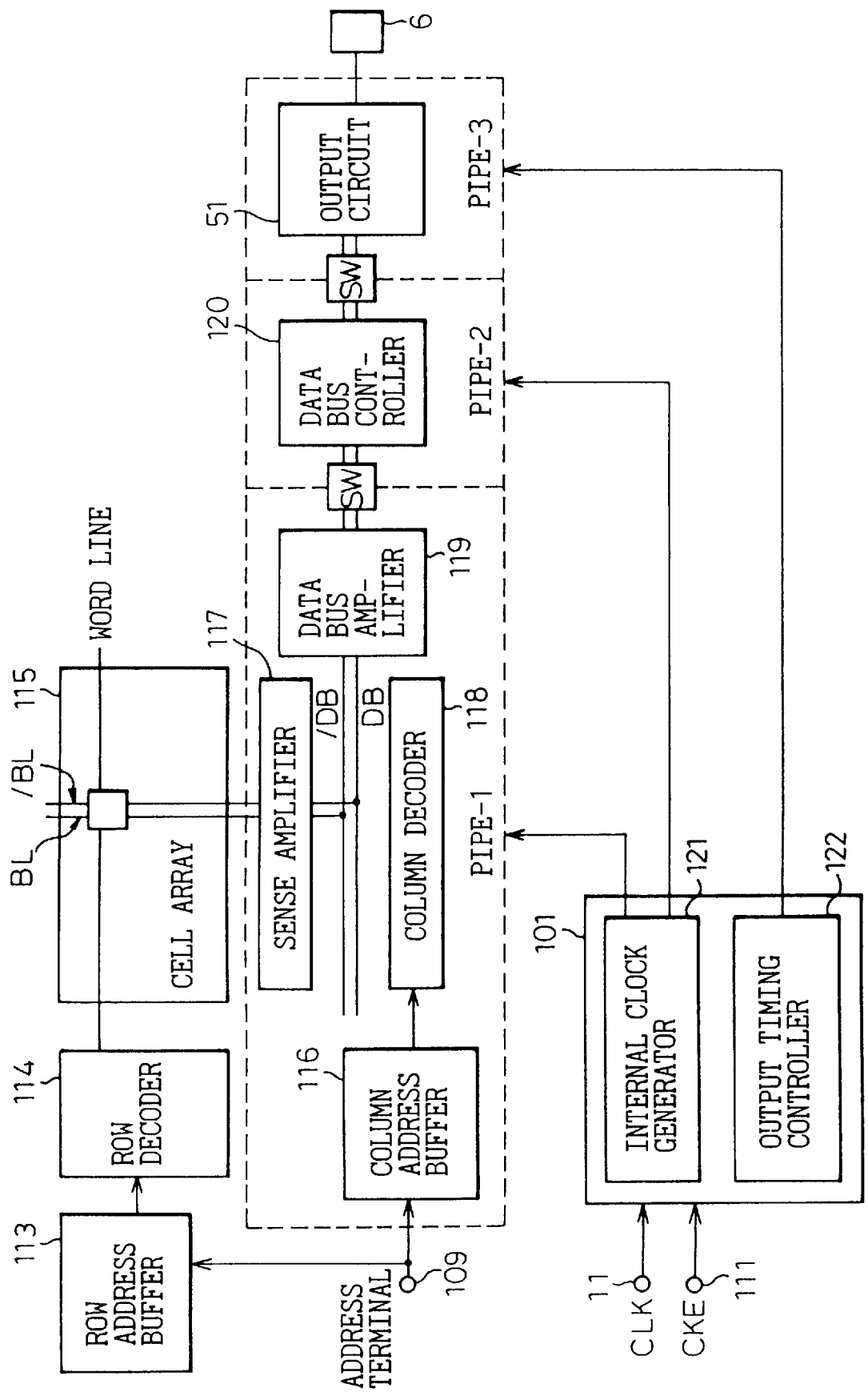
FIG. 26 is a block diagram showing essential parts of the synchronous DRAM of FIG. 24.

FIG. 26 is a block diagram showing essential parts of the SDRAM of FIG. 24 and explains a pipeline operation thereof with, for example, three pipes.

The circuit for processing a column address in the SDRAM is divided into several sections along a processing flow. Each of the divided sections is called a pipe.

As explained with reference to FIG. 24, the buffer 101 has the internal clock generator 121 and output timing controller 122. The internal clock generator 121 generates an ordinary internal clock signal, which is supplied to the pipes 1 and 2. The output timing controller 122 provides a delay-locked (phase-locked) internal clock signal to the output circuit 51 (data output buffer) of the pipe 3.

The supplied internal clock signals control the corresponding pipes. Between the pipes, there is a switch for controlling the transmission timing of a signal between the pipes. These switches are controlled according to the internal clock signal generated by the clock buffer 101 (internal clock generator 121).

In the pipe 1, a column address buffer 116 amplifies an address signal and sends it to a column decoder 118. The column decoder 118 selects an address. Data at the address is amplified by a sense amplifier 117 and then is supplied to a data bus. The data on the data bus is amplified by a data bus amplifier 119. The pipe 2 involves only a data bus controller 120. The pipe 3 involves the I/O buffer 104 (output circuit 51). The data input buffer 13 in the I/O buffer 104 is not shown in FIG. 26.

The circuit(s) in each pipe completes its operation within a clock cycle, and the switch between the pipes is opened and closed in synchronization with the clock signal, to relay data. As a result, the pipes process data in parallel, and data is continuously sent to the output terminal in synchronization with the clock signal.

Figure 27:
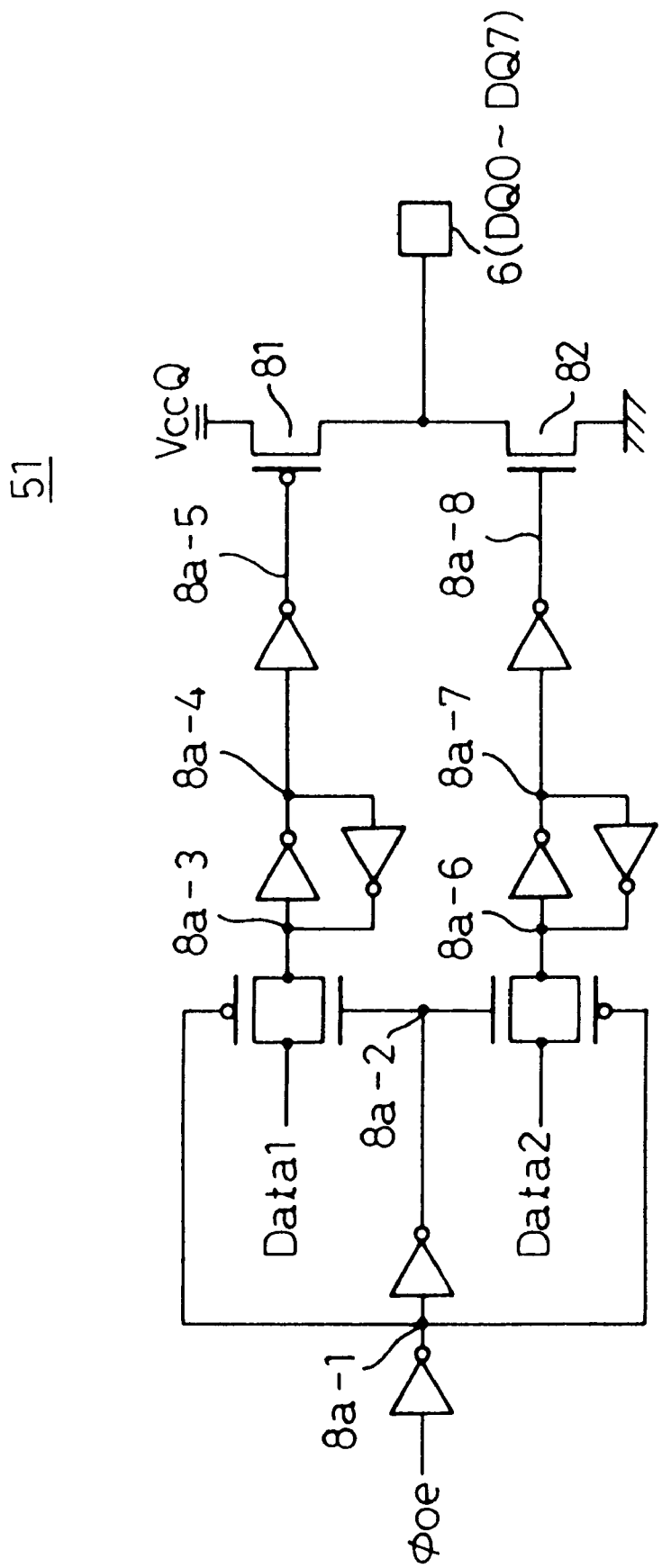
FIG. 27 is a circuit diagram showing an example of an output circuit (data output buffer) of a semiconductor integrated circuit according to the present invention.

FIG. 27 shows an example of the output circuit 51 (data output buffer). As shown in FIGS. 26 and 27, signals Data1 and Data2 correspond to data read out of a cell array 115 through the sense amplifier 117, data bus amplifier 119, and data bus controller 120 of FIG. 26. The signals Data1 and Data2 are each low when the read data is high and are each high when the read data is low. If the read data is not high nor low under a high-impedance (high-Z) state, the data bus controller 120 sets the signal Data1 to high and the signal Data2 to low. A signal φoe corresponds to the internal clock signal from the output timing controller 122 (corresponding to the delay circuit 33 of FIG. 13B) and serves as an enable signal for the output circuit 51.

When the clock signal φoe becomes high, the signals Data1 and Data2 appear at the data output pad 6 (output pads DQ0 to DQ7). When letting the output pad 6 provide a signal of high level, the signal φoe changes from low to high, a node 8*a*-1 to low, and a node 8*a*-2 to high, to turn on transfer gates. Then, the signals Data1 and Data2 are transferred to nodes 8*a*-3 and 8*a*-6. As a result, a node 8*a*-5 changes to low and a node 8*a*-8 to high, to turn on a p-channel transistor 81 and turn off an n-channel transistor 82. Consequently, the data output pad 6 provides a signal of high level. When the signal φoe changes to low, the transfer gates are turned off to hold the current output state.

FIG. 28 shows an example of the dummy line 42 (DL) according to the present invention. As shown in FIG. 28, the dummy line DL is formed on a chip and has the same width as the real line 41 (RL). Note that dummy line DL is formed between the dummy delay circuit 34 and the dummy output circuit 52. Any dummy line may be replaced with a combination of capacitors or resistors.

The present invention is applicable not only to SDRAMs but also to any semiconductor integrated circuits. A pulse signal generated by a semiconductor integrated circuit according to the present invention is used not only as a control signal but also as any other signal.

As explained above in detail, a semiconductor integrated circuit according to the present invention can generate a control signal synchronized with an external signal, even though the speed of the external signal is extremely increased, and further the semiconductor integrated circuit according to the present invention can stabilize a clock signal (control signal) by carrying out a phase comparison operation at a specific timing.

Many different embodiments of the present invention may be constructed without departing from the spirit and scope of the present invention, and it should be understood that the present invention is not limited to the specific embodiments described in this specification, except as defined in the appended claims.

What is claimed is:

1. A phase comparator for comparing phases of first and second signals with each other, said phase comparator comprising:

a first control circuit for dividing a frequency of the first signal by n in response to a timing indicated by a third signal where n is an integer equal to or larger than 2;

a second control circuit for dividing a frequency of the second signal by n in response to the timing indicated by the third signal; and a phase comparator unit for comparing phases of signals provided by said first and second control circuits with each other, said phase comparator being incorporated in a DLL circuit having a delaying line so that the DLL circuit determines a delay according to a phase comparison result provided by said phase comparator, wherein said phase comparator unit has a first RS flip-flop and a second RS flip-flop; said first RS flip-flop having a reset terminal to receive the signal provided by said first control circuit and a set terminal to receive the signal provided by said second control circuit, said second RS flip-flop having a reset terminal to receive the signal provided by said first control circuit through a delay circuit and a set terminal to receive the signal provided by said second control circuit, and said first and second RS flip-flops providing output signals whose combination is used to determine a phase comparison result.

2. A phase comparator for comparing phases of first and second signals with each other, said phase comparator comprising:

a first control circuit for dividing a frequency of the first signal by n in response to a timing indicated by a third signal where n is an integer equal to or larger than 2;

a second control circuit for dividing a frequency of the second signal by n in response to the timing indicated by the third signal; and a phase comparator unit for comparing phases of signals provided by said first and second control circuits with each other, said phase comparator being incorporated in a DLL circuit having a delaying line so that the DLL circuit determines a delay according to a phase comparison result provided by said phase comparator;

wherein said phase comparator unit has a first RS flip-flop and a second RS flip-flop; said first RS flip-flop having a reset terminal to receive the signal provided by said first control circuit and a set terminal to receive the signal provided by said second control circuit, said second RS flip-flop having a reset terminal to receive the signal provided by said first control circuit through a delay circuit and a set terminal to receive the signal provided by said second control circuit, and said first and second RS flip-flops providing output signals whose combination is used to determine a phase comparison result and wherein each of said first and second RS flip-flops has a first NAND circuit and a second NAND circuit, said first NAND circuit having a first input serving as the reset terminal of the respective RS flip-flop and a second input connected to an output of said second NAND circuit serving as an output terminal of said respective RS flip-flop, said second NAND circuit having a first input serving as the set terminal of said respective RS flip-flop and a second input connected to an output of said first NAND circuit serving as an inverting output terminal of said respective RS flip-flop.

3. A phase comparator for comparing phases of first and second signals with each other, said phase comparator comprising:

a first control circuit for dividing a frequency of the first signal by n in response to a timing indicated by a third signal where n is an integer equal to or larger than 2;

a second control circuit for dividing a frequency of the second signal by n in response to the timing indicated by the third signal; and a phase comparator unit for comparing phases of signals provided by said first and second control circuits with each other, said phase comparator being incorporated in a DLL circuit having a delaying line so that the DLL circuit determines a delay according to a phase comparison result provided by said phase comparator;

wherein said phase comparator unit has a first RS flip-flop and a second RS flip-flop; said first RS flip-flop having a reset terminal to receive the signal provided by said first control circuit and a set terminal to receive the signal provided by said second control circuit, said second RS flip-flop having a reset terminal to receive the signal provided by said first control circuit through a delay circuit and a set terminal to receive the signal provided by said second control circuit, and said first and second RS flip-flops providing output signals whose combination is used to determine a phase comparison result, wherein each of said first and second RS flip-flops has a first NAND circuit and a second NAND circuit, said first NAND circuit having a first input serving as the reset terminal of the respective RS flip-flop and a second input connected to an output of said second NAND circuit serving as an output terminal of said respective RS flip-flop, said second NAND circuit having a first input serving as the set terminal of said respective RS flip-flop and a second input connected to an output of said first NAND circuit serving as an inverting output terminal of said respective RS flip-flop and wherein each of said NAND circuits has a first p-channel transistor, a second p-channel transistor, a first n-channel transistor, and a second n-channel transistor; said first p-channel transistor having a source connected to a first power source line, a drain connected to the output of said NAND circuit, and a gate connected to the first input of said NAND circuit; said second p-channel transistor having a source connected to said first power source line, a drain connected to the output of said NAND circuit, and a gate connected to the second input of said NAND circuit; said first n-channel transistor having a source connected to the drain of said second n-channel transistor, a drain connected to the output of said NAND circuit, and a gate connected to the first input of said NAND circuit; and said second n-channel transistor having a source connected to a second power source line and a gate connected to the second input of said NAND circuit.

4. A phase comparator for comparing phases of first and second signals with each other, said phase comparator comprising:

a first control circuit for dividing a frequency of the first signal by n in response to a timing indicated by a third signal where n is an integer equal to or larger than 2;

a second control circuit for dividing a frequency of the second signal by n in response to the timing indicated by the third signal; and a phase comparator unit for comparing phases of signals provided by said first and second control circuits with each other, said phase comparator being incorporated in a DLL circuit having a delaying line so that the DLL circuit determines a delay according to a phase comparison result provided by said phase comparator;

wherein the third signal is formed by dividing a signal which has the same period as the first signal, by n.

5. A phase comparator as claimed in claim 4, wherein each period of a signal provided by any one of said first and second control circuits comprises a first-level interval corresponding to Y periods of any one of the first and second signals and a second-level interval corresponding to Z periods of any one of the first and second signals where Y and Z are positive integers, respectively.

6. A phase comparator as claimed in claim 4, wherein a frequency dividing ratio of the first and second signals is $½^m$ where m is a positive integer.

7. A phase comparator for comparing phases of first and second signals with each other, said phase comparator comprising:

a first control circuit for dividing a frequency of the first signal by n in response to a timing indicated by a third signal where n is an integer equal to or larger than 2;

a second control circuit for dividing a frequency of the second signal by n in response to the timing indicated by the third signal; and a phase comparator unit for comparing phases of signals provided by said first and second control circuits with each other, said phase comparator being incorporated in a DLL circuit having a delaying line so that the DLL circuit determines a delay according to a phase comparison result provided by said phase comparator;

wherein the third signal is formed by shifting the first signal by $\tau/N$ and by dividing a frequency of the shifted signal by n, where $\tau$ is a delay of the second signal from the first signal and N is a positive integer.

8. A phase comparator for comparing phases of first and second signals with each other, said phase comparator comprising:

a first control circuit for dividing a frequency of the first signal by n in response to a timing indicated by a third signal where n is an integer equal to or larger than 2;

a second control circuit for dividing a frequency of the second signal by n in response to the timing indicated by the third signal; and a phase comparator unit for comparing phases of signals provided by said first and second control circuits with each other, said phase comparator being incorporated in a DLL circuit having a delaying line so that the DLL circuit determines a delay according to a phase comparison result provided by said phase comparator;

wherein each of said first and second control circuits has a first latch circuit for storing the third signal in response to a trigger signal that is an inversion of a corresponding one of the first and second signals, and a second latch circuit for storing signals held in said first latch circuit in response to a trigger signal that is the corresponding one of the first and second signals.

9. A phase comparator for comparing phases of first and second signals with each other, said phase comparator comprising:

a first control circuit for dividing a frequency of the first signal by n in response to a timing indicated by a third signal where n is an integer equal to or larger than 2;

a second control circuit for dividing a frequency of the second signal by n in response to the timing indicated by the third signal; and a phase comparator unit for comparing phases of signals provided by said first and second control circuits with each other, said phase comparator being incorporated in a DLL circuit having a delaying line so that the DLL circuit determines a delay according to a phase comparison result provided by said phase comparator;

wherein the third signal has the same period a) of the signal obtained by dividing the frequency of the first signal by n and b) of the signal obtained by dividing the frequency of the second signal by n, the third signal includes an active state and an inactive state, a transitional timing changing from the inactive state to the active state is delayed from a transitional timing of the first signal by a half of a time difference between the first and second signals.

10. A phase comparator for comparing phases of first and second signals with each other, said phase comparator comprising:

a first control circuit for dividing a frequency of the first signal by n in response to a timing indicated by a third signal where n is an integer equal to or larger than 2;

a second control circuit for dividing a frequency of the second signal by n in response to the timing indicated by the third signal; and a phase comparator unit for comparing phases of signals provided by said first and second control circuits with each other, said phase comparator being incorporated in a DLL circuit having a delaying line so that the DLL circuit determines a delay according to a phase comparison result provided by said phase comparator;

wherein the third signal has the same period a) of the signal obtained by dividing the frequency of the first signal by n and b) of the signal obtained by dividing the frequency of the second signal by n, the third signal includes an active state and an inactive state, a transitional timing changing from the inactive state to the active state is delayed from a transitional timing of the first signal by a half of a time difference between the first and second signals and wherein an interval of the active state of the third signal is the same as one of the first signal.

11. A semiconductor integrated circuit comprising:
a DLL circuit, said DLL circuit including
  a delay circuit for delaying a first signal and providing a second signal,
  a delay control circuit for controlling a delay of said delay circuit, and
  a phase comparator for comparing phases of the first and second signals with each other and controlling an operation of said delay control circuit accordingly, wherein said phase comparator including
    a first control circuit for dividing a frequency of the first signal by n in response to a timing indicated by a third signal where n is an integer equal to or larger than 2;
    a second control circuit for dividing a frequency of the second signal by n in response to the timing indicated by the third signal; and
    a phase comparator unit for comparing phases of signals provided by said first and second control circuits with each other.

12. A semiconductor integrated circuit as claimed in claim 11, wherein each period of a signal provided by any one of said first and second control circuits comprises a first-level interval corresponding to Y periods of any one of the first and second signals and a second-level interval corresponding to Z periods of any one of the first and second signals where Y and Z are positive integers, respectively.

13. A semiconductor integrated circuit as claimed in claim 11, wherein said phase comparator unit has a first RS flip-flop and a second RS flip-flop; said first RS flip-flop having a reset terminal to receive the signal provided by said first control circuit and a set terminal to receive the signal provided by said second control circuit, said second RS flip-flop having a reset terminal to receive the signal provided by said first control circuit through a delay circuit and a set terminal to receive the signal provided by said second control circuit, and said first and second RS flip-flops providing output signals whose combination is used to determine a phase comparison result.

14. A semiconductor integrated circuit as claimed in claim 13, wherein each of said first and second RS flip-flops has a first NAND circuit and a second NAND circuit, said first NAND circuit having a first input serving as the reset terminal of the respective RS flip-flop and a second input connected to an output of said second NAND circuit serving as an output terminal of said respective RS flip-flop, said second NAND circuit having a first input serving as the set terminal of said respective RS flip-flop and a second input connected to an output of said first NAND circuit serving as an inverting output terminal of said respective RS flip-flop.

15. A semiconductor integrated circuit as claimed in claim 14, wherein each of said NAND circuits has a first p-channel transistor, a second p-channel transistor, a first n-channel transistor, and a second n-channel transistor; said first p-channel transistor having a source connected to a first power source line, a drain connected to the output of said NAND circuit, and a gate connected to the first input of said NAND circuit; said second p-channel transistor having a source connected to said first power source line, a drain connected to the output of said NAND circuit, and a gate connected to the second input of said NAND circuit; said first n-channel transistor having a source connected to the drain of said second n-channel transistor, a drain connected to the output of said NAND circuit, and a gate connected to the first input of said NAND circuit; and said second n-channel transistor having a source connected to a second power source line and a gate connected to the second input of said NAND circuit.

16. A semiconductor integrated circuit as claimed in claim 11, wherein said semiconductor integrated circuit further comprises a frequency divider for forming the third signal by dividing a signal, which has the same period as the first signal, by n.

17. A semiconductor integrated circuit as claimed in claim 16, wherein said semiconductor integrated circuit further comprises a circuit for shifting the first signal by $\tau/N$ where $\tau$ is a delay of the second signal from the first signal and N is a positive integer and forming the third signal by dividing a frequency of the shifted signal by n with the use of said frequency divider.

18. A semiconductor integrated circuit as claimed in claim 11, wherein a frequency dividing ratio of the first and second signals is $\frac{1}{2}^m$ where m is a positive integer.

19. A semiconductor integrated circuit as claimed in claim 11, wherein each of said first and second control circuits has a first latch circuit for storing the third signal in response to a trigger signal that is an inversion of a corresponding one of the first and second signals, and a second latch circuit for storing signals held in said first latch circuit in response to a trigger signal that is the corresponding one of the first and second signals.

20. A semiconductor integrated circuit comprising:
a first DLL circuit,
a second DLL circuit, and
an output circuit, one of output signals of said first and second DLL circuits being selected and supplied to said output circuit, said first DLL circuit including
  a delay circuit for delaying a first signal and providing a second signal,
  a delay control circuit for controlling a delay of said delay circuit, and
  a phase comparator for comparing phases of the first and second signals with each other and controlling an operation of said delay control circuit accordingly, wherein said phase comparator including
    a first control circuit for dividing a frequency of the first signal by n in response to a timing indicated by a third signal where n is an integer equal to or larger than 2;
    a second control circuit for dividing a frequency of the second signal by n in response to the timing indicated by the third signal; and
    a phase comparator unit for comparing phases of signals provided by said first and second control circuits with each other.

21. A semiconductor integrated circuit as claimed in claim 20, wherein each period of a signal provided by any one of said first and second control circuits comprises a first-level interval corresponding to Y periods of any one of the first and second signals and a second-level interval corresponding to Z periods of any one of the first and second signals where Y and Z are positive integers, respectively.

22. A semiconductor integrated circuit as claimed in claim 20, wherein said phase comparator unit has a first RS flip-flop and a second RS flip-flop; said first RS flip-flop having a reset terminal to receive the signal provided by said first control circuit and a set terminal to receive the signal provided by said second control circuit, said second RS flip-flop having a reset terminal to receive the signal provided by said first control circuit through a delay circuit and a set terminal to receive the signal provided by said second control circuit, and said first and second RS flip-flops providing output signals whose combination is used to determine a phase comparison result.

23. A semiconductor integrated circuit as claimed in claim 22, wherein each of said first and second RS flip-flops has a first NAND circuit and a second NAND circuit, said first NAND circuit having a first input serving as the reset terminal of the respective RS flip-flop and a second input connected to an output of said second NAND circuit serving as an output terminal of said respective RS flip-flop, said second NAND circuit having a first input serving as the set terminal of said respective RS flip-flop and a second input connected to an output of said first NAND circuit serving as an inverting output terminal of said respective RS flip-flop.

24. A semiconductor integrated circuit as claimed in claim 23, wherein each of said NAND circuits has a first p-channel transistor, a second p-channel transistor, a first n-channel transistor, and a second n-channel transistor; said first p-channel transistor having a source connected to a first power source line, a drain connected to the output of said NAND circuit, and a gate connected to the first input of said NAND circuit; said second p-channel transistor having a source connected to said first power source line, a drain connected to the output of said NAND circuit, and a gate connected to the second input of said NAND circuit; said first n-channel transistor having a source connected to the drain of said second n-channel transistor, a drain connected to the output of said NAND circuit, and a gate connected to the first input of said NAND circuit; and said second n-channel transistor having a source connected to a second power source line and a gate connected to the second input of said NAND circuit.

25. A semiconductor integrated circuit as claimed in claim 20, wherein said semiconductor integrated further comprises a frequency divider for forming the third signal by dividing a signal, which has the same period as the first signal, by n.

26. A semiconductor integrated circuit as claimed in claim 25, wherein said semiconductor integrated circuit further comprises a circuit for shifting the first signal by $\tau/N$ where $\tau$ is a delay of the second signal from the first signal and N is a positive integer and forming the third signal by dividing a frequency of the shifted signal by n with the use of said frequency divider.

27. A semiconductor integrated circuit as claimed in claim 20, wherein a frequency dividing ratio of the first and second signals is $\frac{1}{2}^m$ where m is a positive integer.

28. A semiconductor integrated circuit as claimed in claim 20, wherein each of said first and second control circuits has a first latch circuit for storing the third signal in response to a trigger signal that is an inversion of a corresponding one of the first and second signals, and a second latch circuit for storing signals held in said first latch circuit in response to a trigger signal that is the corresponding one of the first and second signals.

29. A semiconductor integrated circuit as claimed in claim 20, wherein said semiconductor integrated circuit is a synchronous DRAM and said output circuit is an output circuit of said synchronous DRAM.

* * * * *